United States Patent
Safrani et al.

(10) Patent No.: US 10,354,373 B2
(45) Date of Patent: Jul. 16, 2019

(54) SYSTEM AND METHOD FOR PHOTOMASK ALIGNMENT AND ORIENTATION CHARACTERIZATION BASED ON NOTCH DETECTION

(71) Applicant: KLA-Tencor Corporation, Milpitas, CA (US)

(72) Inventors: Avner Safrani, Misgav (IL); Ron Rudoi, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/908,553

(22) Filed: Feb. 28, 2018

(65) Prior Publication Data

US 2018/0315179 A1    Nov. 1, 2018

Related U.S. Application Data

(60) Provisional application No. 62/490,366, filed on Apr. 26, 2017.

(51) Int. Cl.
   *G06T 7/00* (2017.01)
   *G06T 7/73* (2017.01)
   (Continued)

(52) U.S. Cl.
   CPC .............. *G06T 7/0004* (2013.01); *G03F 1/42* (2013.01); *G03F 1/70* (2013.01); *G03F 7/70741* (2013.01);
   (Continued)

(58) Field of Classification Search
   None
   See application file for complete search history.

(56) References Cited

U.S. PATENT DOCUMENTS

| | | |
|---|---|---|
| 6,573,993 B2 | 6/2003 | Little |
| 6,864,954 B2 | 3/2005 | Suzuki |

(Continued)

FOREIGN PATENT DOCUMENTS

| | | |
|---|---|---|
| JP | 2000031245 A | 1/2000 |
| JP | 2005093678 A | 4/2005 |
| WO | 2015123222 A1 | 8/2015 |

OTHER PUBLICATIONS

Dusa, M. et al., "Comprehensive metrology-detection strategies for sub-0.5 μm lithography reticles", Proc. SPIE 2512, Photomask and X-Ray Mask Technology II, 253, (Jul. 3, 1995); doi: 10.1117/12.212778; https://dx.doi.org/10.1117/12.212778.

(Continued)

*Primary Examiner* — Vikkram Bali
(74) *Attorney, Agent, or Firm* — Suiter Swantz pc llo

(57) ABSTRACT

A notch detection system receives images of a sample from the imaging detector, in which the sample includes a notched surface and an un-notched surface bounded by a sidewall and further includes at least one notch known notch specifications. The images are generated such that illumination unobstructed by the sample is received by the detector and the sample prevents incident illumination from reaching the detector. The system further determines whether each image includes a notch, identifies the notched surface, and directs a sample positioner to position the sample with the notched surface in a selected direction when a notch is identified in at least one image of the one or more images.

52 Claims, 17 Drawing Sheets

(51) Int. Cl.
*G03F 1/70* (2012.01)
*H01L 21/68* (2006.01)
*G03F 1/42* (2012.01)
*G03F 7/20* (2006.01)

(52) U.S. Cl.
CPC .............. *G06T 7/73* (2017.01); *H01L 21/681* (2013.01); *H01L 21/682* (2013.01); *G06T 2207/30148* (2013.01)

(56) References Cited

U.S. PATENT DOCUMENTS

| | | | |
|---|---|---|---|
| 6,979,910 B2 * | 12/2005 | Shirasaka | H01L 23/544 257/401 |
| 7,224,446 B2 | 5/2007 | Kreh et al. | |
| 7,853,919 B2 | 12/2010 | Huang et al. | |
| 7,989,968 B2 | 8/2011 | Granados et al. | |
| 8,165,383 B2 | 4/2012 | Faivishevsky | |
| 8,348,255 B2 | 1/2013 | Munakata | |
| 8,873,830 B2 | 10/2014 | Yamanaka | |
| 9,053,287 B1 | 6/2015 | Acosta et al. | |
| 2005/0062960 A1 | 3/2005 | Tsuji et al. | |
| 2007/0085988 A1 | 4/2007 | Kim | |
| 2008/0013089 A1 | 1/2008 | Ishii et al. | |
| 2011/0085725 A1 | 4/2011 | Pai et al. | |
| 2013/0026380 A1 * | 1/2013 | Tkaczyk | G01T 1/2928 250/370.13 |
| 2013/0171744 A1 * | 7/2013 | Kang | H01L 21/67115 438/4 |
| 2016/0123724 A1 | 5/2016 | Hetzler et al. | |
| 2017/0028560 A1 | 2/2017 | Senn | |

OTHER PUBLICATIONS

Cong, M. et al., "Wafer Pre-Aligner System Based on Vision Information Processing", Information Technology Journal 6 (8): 1245-1251, 2007.

Acosta, C. et al., "A novel algorithm for notch detection", Proc. SPIE 8701, Photomask and Next-Generation Lithography Mask Technology XX, 87010N (Jun. 28, 2013); doi: 10.1117/12.2028471; https://dx.doi.org/10.1117/12.2028471.

International Search Report dated Aug. 10, 2018 for PCT/US2018/029645.

* cited by examiner

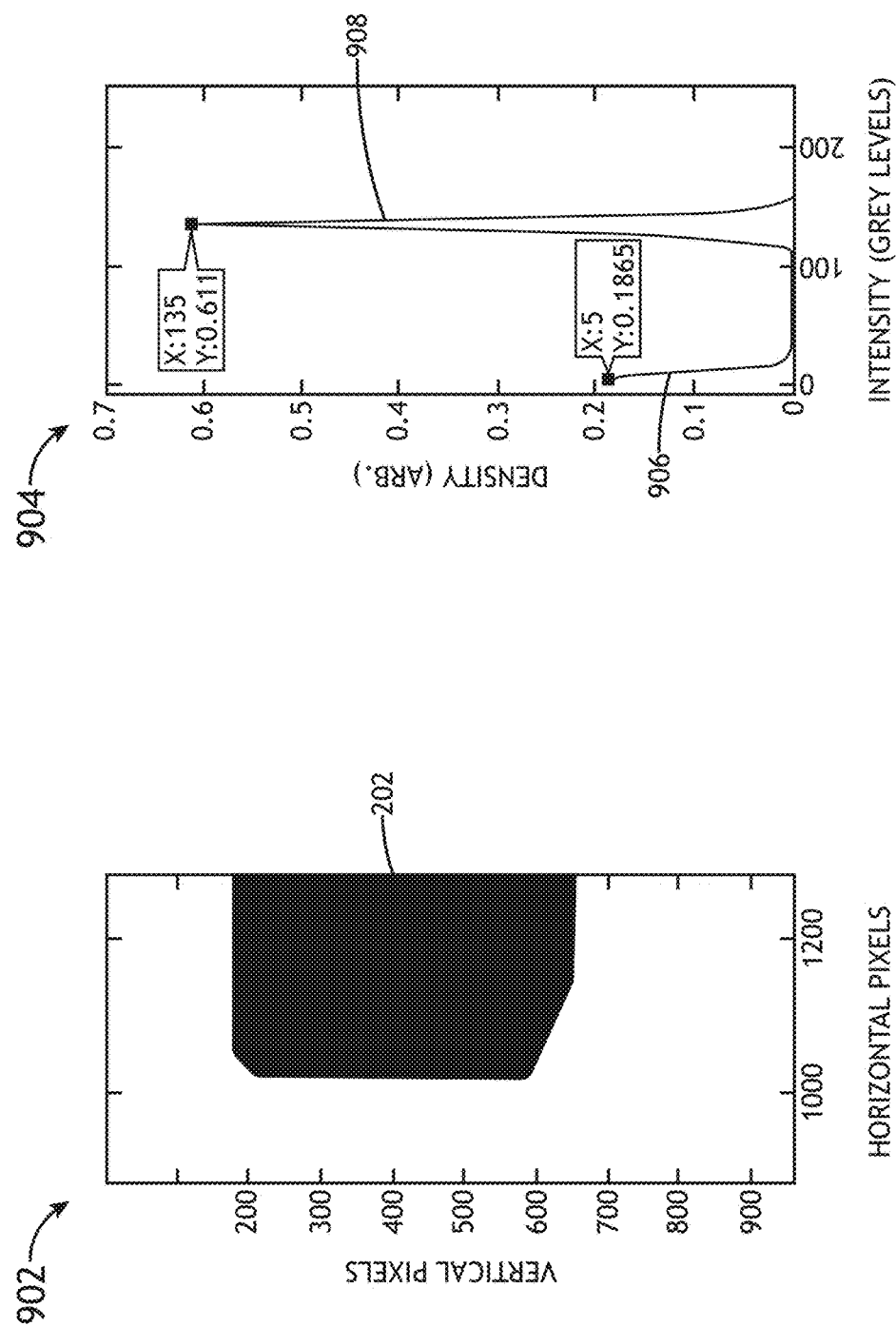

SYSTEM AND METHOD FOR PHOTOMASK ALIGNMENT AND ORIENTATION CHARACTERIZATION BASED ON NOTCH DETECTION

CROSS-REFERENCE TO RELATED APPLICATION

The present application claims the benefit under 35 U.S.C. § 119(e) of U.S. Provisional Application Ser. No. 62/490,366, filed Apr. 26, 2017, entitled METHOD FOR PHOTO MASK NOTCH DETECTION, naming Avner Safrani and Ron Rudoi as inventors, which is incorporated herein by reference in the entirety.

TECHNICAL FIELD

The present disclosure is directed generally to sample positioning and, more particularly, to orienting reticles based on locations of identified notches.

BACKGROUND

Photomasks (e.g., reticles) used in the semiconductor industry typically include identifying structures such as but not limited to, notches on one or more corners to identify a coated and/or patterned surface. Because photomasks may be utilized to print on thousands of wafers, they are routinely monitored for defects to ensure quality control. Photomasks may thus be frequently transported between fabrication tools and metrology equipment. However, any contact between coated and/or patterned surface could be damaging to the photomask. Therefore, it may be desirable to provide systems and methods for determining the orientation of photomasks in a fabrication line.

SUMMARY

A notch detection system is disclosed in accordance with one or more illustrative embodiments of the present disclosure. In one illustrative embodiment, the system includes a controller communicatively coupled to an imaging detector. In another illustrative embodiment, the controller includes one or more processors to inspect one or more edges of a sample for notches. In another illustrative embodiment, inspection of an edge comprises receiving one or more images of a sample from the imaging detector. In another illustrative embodiment, the sample includes a notched surface and an un-notched surface parallel to the notched surface. In another illustrative embodiment, the notched surface and the un-notched surface are bounded by a sidewall. In another illustrative embodiment, the sample includes at least one notch providing a transitional surface between the notched surface and the sidewall having known notch specifications. In another illustrative embodiment, each image of the one or more images includes a profile view of a respective corner of the sample, the profile view including at least a portion of the sidewall and top and bottom edges associated with the notched surface and the un-notched surface, wherein illumination from an illuminator unobstructed by the sample is received by the detector. In another illustrative embodiment, the sample prevents illumination from the illuminator incident on the sidewall from reaching the detector. In another illustrative embodiment, inspection of an edge further comprises determining whether the respective corner in each image of the one or more images includes a notch, wherein the notch is identifiable as a transitional edge between one of the top surface or the bottom surface and the sidewall having the known notch specifications. In another illustrative embodiment, inspection of an edge further comprises identifying the notched surface as one of the top surface or the bottom surface when a notch is detected. In another illustrative embodiment, inspection of an edge further comprises directing a sample positioner to position the sample with the notched surface in a selected direction when a notch is identified in at least one image of the one or more images.

A notch detection system is disclosed in accordance with one or more illustrative embodiments of the present disclosure. In one illustrative embodiment, the system includes an illuminator to provide diffuse illumination. In another illustrative embodiment, the system includes an imaging detector. In another illustrative embodiment, the system includes a stage configured to secure a sample. In another illustrative embodiment, the sample includes a notched surface and an un-notched surface parallel to the notched surface, wherein the notched surface and the un-notched surface are bounded by a sidewall. In another illustrative embodiment, the sample includes at least one notch providing a transitional surface between the notched surface and the sidewall having known notch specifications. In another illustrative embodiment, the system includes a controller communicatively coupled to an imaging detector and the stage. In another illustrative embodiment, the controller receives one or more images of a sample from the imaging detector. In another illustrative embodiment, each image of the one or more images includes a profile view of a respective corner of the sample, the profile view including at least a portion of the sidewall and top and bottom edges associated with the notched surface and the un-notched surface. In another illustrative embodiment, the stage positions the sample for each image of the one or more images such that illumination from an illuminator unobstructed by the sample is received by the detector. In another illustrative embodiment, the sample prevents illumination from the illuminator incident on the sidewall from reaching the detector. In another illustrative embodiment, the controller further determines whether the respective corner in each image of the one or more images includes a notch, wherein the notch is identifiable as a transitional edge between one of the top surface or the bottom surface and the sidewall having the known notch specifications. In another illustrative embodiment, the controller further identifies the notched surface as one of the top surface or the bottom surface when a notch is detected. In another illustrative embodiment, the controller directs a sample positioner to position the sample with the notched surface in a selected direction when a notch is identified in at least one image of the one or more images.

An alignment system is disclosed in accordance with one or more illustrative embodiments of the present disclosure. In one illustrative embodiment, the system includes a notch detection system. In another illustrative embodiment, the notch detection system includes an illuminator configured to provide diffuse illumination, an imaging detector, and a stage to secure a sample. In another illustrative embodiment the sample includes a notched surface and an un-notched surface parallel to the notched surface, wherein the notched surface and the un-notched surface are bounded by a sidewall. In another illustrative embodiment, the sample includes at least one notch providing a transitional surface between the notched surface and the sidewall having known notch specifications. In another illustrative embodiment, the system includes a controller. In another illustrative embodiment, the controller receives one or more images of a sample from the imaging detector. In another illustrative embodiment, each image of the one or more images includes a profile view of a respective corner of the sample. In another illustrative embodiment, the profile view including at least a portion of the sidewall and top and bottom edges associated with the notched surface and the un-notched surface. In another illustrative embodiment, the stage positions the sample for each image of the one or more images such that illumination from an illuminator unobstructed by the sample is received by the detector, wherein the sample prevents illumination from the illuminator incident on the sidewall from reaching the detector. In another illustrative embodiment, the controller further determines whether the respective corner in each image of the one or more images includes a notch, wherein the notch is identifiable as a transitional edge between one of the top surface or the bottom surface and the sidewall having the known notch specifications. In another illustrative embodiment, the controller further identifies the notched surface as one of the top surface or the bottom surface when a notch is detected. In another illustrative embodiment, the system includes a sample positioner configured to position the sample with the notched surface in a selected direction when a notch is identified in at least one image of the one or more images.

A method for notch detection is disclosed in accordance with one or more illustrative embodiments of the present disclosure. In one illustrative embodiment, the method includes receiving a sample including a notched surface and an un-notched surface parallel to the notched surface. In another illustrative embodiment, the notched surface and the un-notched surface are bounded by a sidewall. In another illustrative embodiment, the sample includes at least one notch providing a transitional surface between the notched surface and the sidewall having known notch specifications. In another illustrative embodiment, the method includes generating, with an imaging sub-system including an illuminator and a detector, one or more images of the sample, wherein each image of the one or more images includes a profile view of a respective corner of the sample, the profile view including at least a portion of the sidewall and top and bottom edges associated with the notched surface and the un-notched surface. In another illustrative embodiment, illumination from the illuminator unobstructed by the sample is received by the detector. In another illustrative embodiment, the sample prevents illumination from the illuminator incident on the sidewall from reaching the detector. In another illustrative embodiment, the method includes determining whether the respective corner in each image of the one or more images includes a notch. In another illustrative embodiment, the notch is identifiable as a transitional edge between one of the top surface or the bottom surface and the sidewall having the known notch specifications. In another illustrative embodiment, the method includes identifying the notched surface as one of the top surface or the bottom surface when a notch is detected. In another illustrative embodiment, the method includes positioning the sample with the notched surface in a selected direction when a notch is identified in at least one image of the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 9A includes a binary image generated from the image of FIG. 7, in accordance with one or more embodiments of the present disclosure.

FIG. 9B includes a histogram of pixel values of the image of FIG. 7, in accordance with one or more embodiments of the present disclosure.

DETAILED DESCRIPTION

Figure 1:
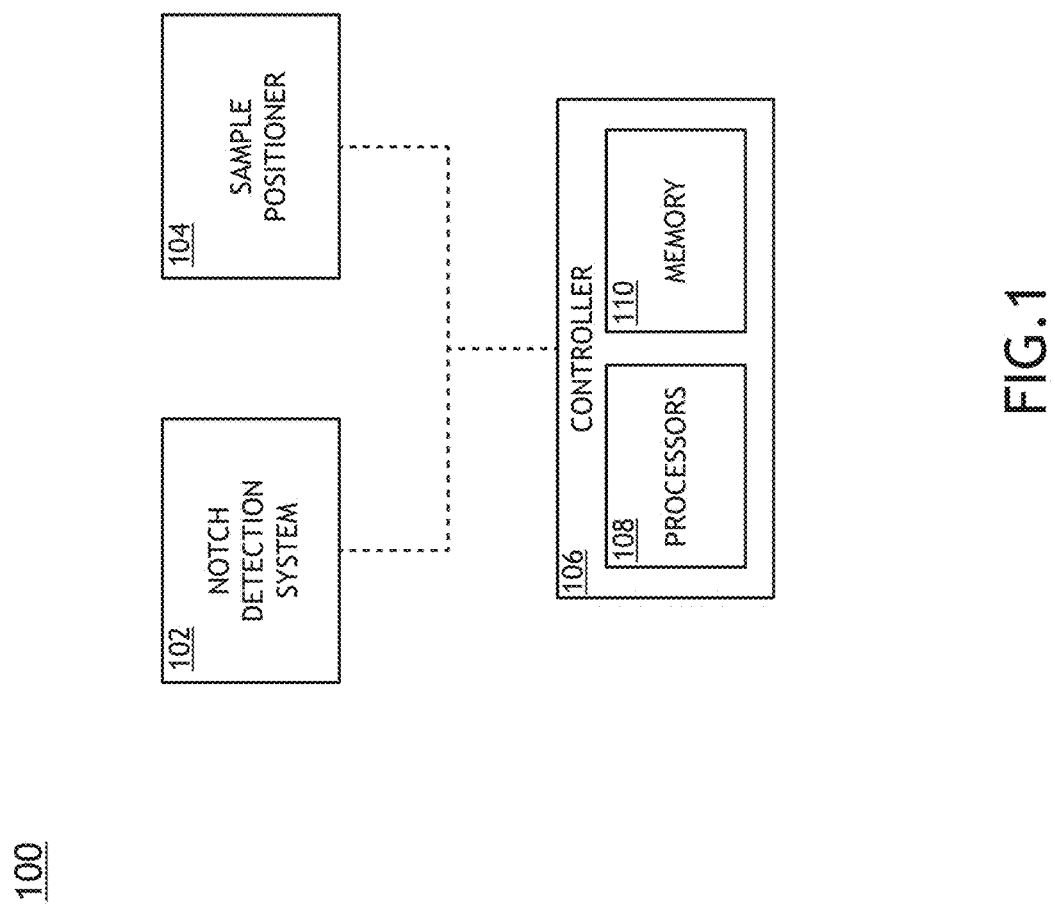
FIG. 1 is a conceptual view of a sample alignment system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a notch detection system for determining the orientation of a photomask and adjusting the orientation as necessary. Photomasks may be routinely placed in a reticle magazine for transport between fabrication tools (e.g., lithography tools) and metrology tools for inspection. However, the photomasks may be arbitrarily placed in the reticle magazines such that the orientation of the coated and/or patterned surface of a particular photomask within the magazine may not be known. Because any contact between the coated and/or patterned surface may damage the photomasks, great care must be taken to ensure that each photomask is properly oriented when placed in a fabrication tool and/or a metrology tool.

Photomasks typically include one or more identifying features to identify the coated and/or patterned surface. Further, the physical characteristics of photomasks as well as any identifying features may be, but are not required to be, defined in one or more standards. For example, the SEMI standard P1-0708E may provide general requirements of the glass substrate for hard surface photomasks up to 7 inches in length.

Embodiments of the present disclosure are directed to a notch detection device to determine the orientation of photomasks with one or more corner notches as identifying features for identifying a coated and/or patterned surface. For example, photomasks may include two parallel surfaces bounded by a sidewall and may further include notches on one or more corners (e.g., truncated corners, or the like). In this regard, a notch may include a transitional surface between a "notched" surface and the sidewall in which the transitional surface exhibits known specifications (e.g., notch specifications) that differ from the surrounding regions. For instance, the notch specifications may include, but are not limited to, a length of the transitional surface, a slope of the transitional surface with respect to the notched surface, or the like. Further, the coated/patterned surface may correspond to either the notched surface or the opposite "un-notched" surface.

Additional embodiments are directed to generating high-contrast profile images of photomask corners and determining whether each corner has a notch based on the generated images. For example, high-contrast images may be generated by illuminating a sidewall at a corner of a photomask with diffuse illumination and imaging the corner of the photomask with a detector facing the illumination source (e.g., a pitch-catch illumination system). Accordingly, light from the illumination source not incident on the photomask may propagate directly to the detector and light incident on the photomask may be substantially blocked, absorbed, and/or reflected such that it does not reach the detector.

Further, the images may include at least a portion of the sidewall and top and bottom edges corresponding to the notched surface and the un-notched surface. In this regard, transitional surfaces between the top and bottom surfaces may be visible as transitional edges between the sidewall and the top/bottom edges in the images. Further, a notch may be identified when a transitional edge between the sidewall and the top or bottom edge falls within the known notch specifications.

It is recognized herein that generating high-contrast profile images may provide a robust and accurate notch detection method. For example, the high-contrast images may be efficiently and accurately analyzed. Further, the detection may be robust to deviations in the measurement process such as, but not limited to, light source deviations, deviations of the tip and/or tilt of the photomask, or the like.

It is further recognized that generating high-contrast profile images may provide a flexible platform for notch detection on a variety of photomask geometries. For example, a photomask may have any type of transitional surfaces between the sidewall and the notched/un-notched surfaces such as, but not limited to, chamfered edges, beveled edges, sharp right-angle edges, or the like. Regardless of the shape of the photomask, a notch that deviates from the surrounding regions may be visible.

Additional embodiments of the present disclosure are directed to positioning the photomask with the notched surface in a selected direction when a notch is identified. For example, the photomask may be positioned in a notch detection system with a coated/patterned surface oriented (e.g., facing) in an unknown direction. In this regard, determining an orientation of the notched surface based on the images may allow identification of the notched surface. The photomask may thus be properly inserted into a fabrication tool (e.g., a lithography tool, a metrology tool, or the like) with the notched surface facing a selected direction to avoid damage to the coated/patterned surface. For example, the photomask may be flipped prior to insertion into the fabrication tool if necessary depending on the initial orientation of the notched surface in the reticle magazine.

FIG. 1 is a conceptual view of a sample orientation detection system 100, in accordance with one or more embodiments of the present disclosure. In one embodiment, the sample orientation detection system 100 incudes a notch detection system 102 to identify notches in one or more corners of a photomask. In another embodiment, the sample orientation detection system 100 includes a sample positioner 104 to orient and/or position the photomask in a selected direction when a notch is identified by the notch detection system 102. In another embodiment, the sample orientation detection system 100 includes a controller 106 including one or more processors 108 configured to execute program instructions maintained on a memory medium 110. In this regard, the one or more processors 108 of controller 106 may execute any of the various process steps described throughout the present disclosure.

The one or more processors 108 of controller 106 may include any processing elements known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the sample orientation detection system 100, as described throughout the present disclosure. It is further recognized that the term "processor" may be broadly defined to encompass any device having one or more processing elements, which execute program instructions from a non-transitory memory medium 110.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory (ROM), a random access memory (RAM), a magnetic or optical memory device (e.g., disk), a magnetic tape, a solid state drive, and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

Referring generally to FIGS. 2A through 2E, a sample 202 (e.g., a photomask, a reticle, or the like) having a notch 204 to identify and distinguish a notched surface 206 from an un-notched surface 208 is illustrated in accordance with one or more embodiments of the present disclosure. In one embodiment, the sample 202 includes two parallel surfaces identified as a notched surface 206 and a un-notched surface 208 that are bounded by a sidewall 210. In this regard, the sample 202 may form a solid material slab. It is to be understood that the terms "notched surface" and "un-notched surface" are used throughout the present disclosure merely to distinguish a surface having a notch 204 from a surface without a notch 204. Accordingly, the terms "notched surface" and "un-notched surface" are not intended to limit the presence of any additional features on a surface.

The sample 202 may be formed from any material or combination of materials. In one embodiment, the sample 202 includes a glass such as, but not limited to, fused silica, soda-lime glass, or borosilicate glass. In another embodiment, the sample 202 includes a semiconductor material such as, but not limited to, silicon or gallium-arsenide. In this regard, the sample 202 may include a semiconductor wafer. In another embodiment, the sample 202 includes a metal such as, but not limited to, aluminum, nickel, or the like. In another embodiment, the sample 202 includes a metal alloy such as, but not limited to, a steel alloy. In another embodiment, the sample 202 includes a polymer such as, but not limited to SU-8.

The sample 202 may further include one or more patterned or unpatterned films deposited on a surface (e.g., either the notched surface 206 or the un-notched surface 208). For example, a sample 202 including a photomask may include a patterned chrome layer deposited on a surface (e.g., either the notched surface 206 or the un-notched surface 208) suitable for exposing a wafer with a desired pattern in a lithography process. In this regard, detection of the notch 204 (e.g., by the sample orientation detection system 100) may identify the patterned surface such that the patterned surface may be oriented in a selected direction (e.g., in a fabrication tool).

Figure 2A:
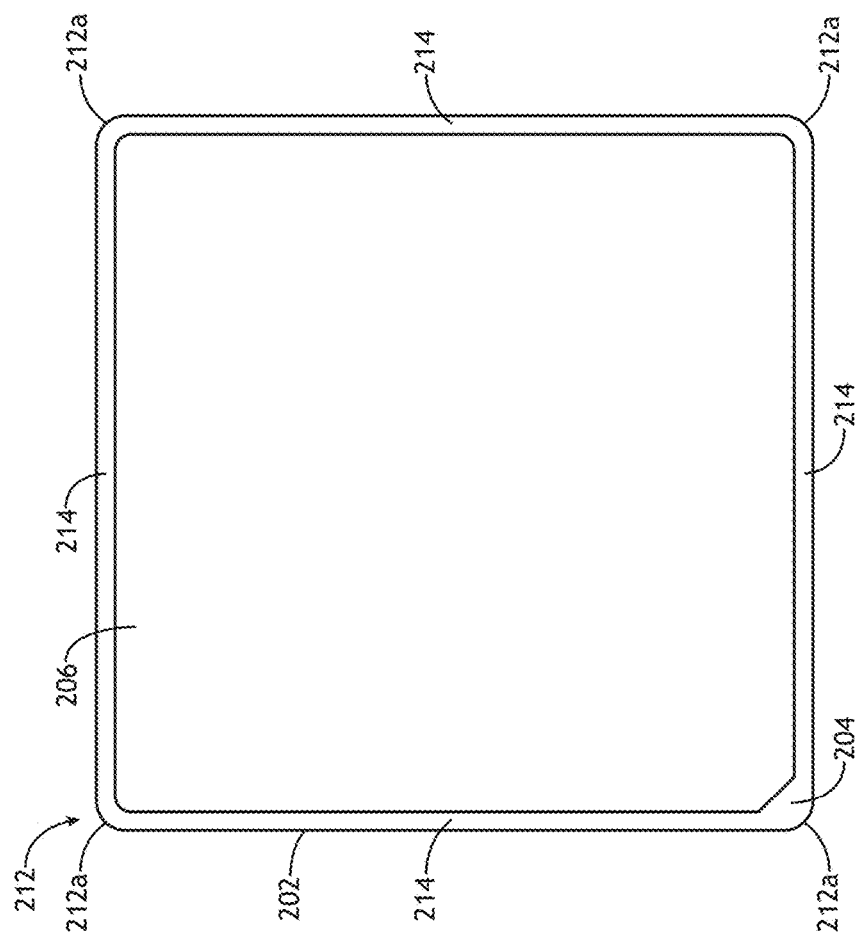
FIG. 2A is a top view of the sample illustrating a notched surface, in accordance with one or more embodiments of the present disclosure.

FIG. 2A is a top view of the sample 202 illustrating a notched surface 206, in accordance with one or more embodiments of the present disclosure. In one embodiment, the sample 202 has a notch 204 on one or more corners 212.

Figure 2B:
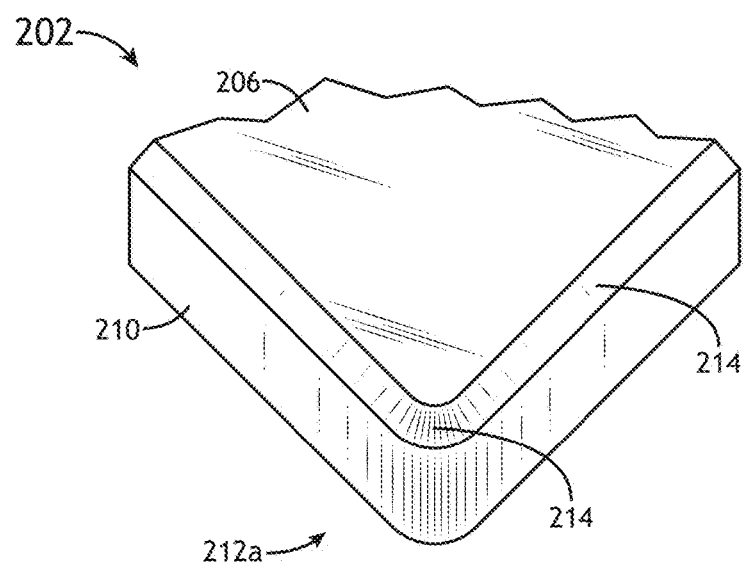
FIG. 2B is an isometric view of an un-notched corner of a sample, in accordance with one or more embodiments of the present disclosure.
Figure 2C:
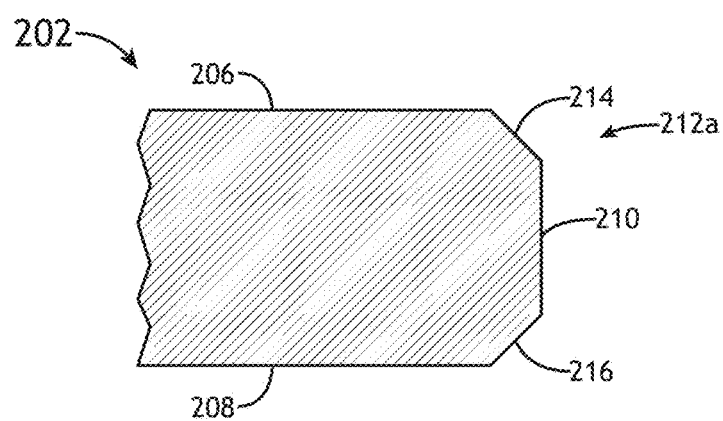
FIG. 2C is a profile view of an un-notched corner of a sample, in accordance with one or more embodiments of the present disclosure.

FIG. 2B is an isometric view of an un-notched corner 212a of the sample 202, in accordance with one or more embodiments of the present disclosure. FIG. 2C is a profile view of an un-notched corner 212a of the sample 202, in accordance with one or more embodiments of the present disclosure. The sample 202 may have any type of transitional surfaces and/or edges between the sidewall 210 and the parallel notched surface 206 and un-notched surface 208. For example, as illustrated in FIGS. 2B and 2C, the sample 202 may be chamfered to include a first transitional surface 214 between the sidewall 210 and the notched surface 206 as well as a second transitional surface 216 between the sidewall 210 and the un-notched surface 208. Further, in the profile view of FIG. 2C, the first transitional surface 214 and the second transitional surface 216 may appear as lines or edges. By way of another example, the sample 202 may be beveled such that the first transitional surface 214 and the second transitional surface 216 may have any arbitrary shape (e.g., a curved shape, a multi-faced shape, or the like). By way of another example, the sample 202 may include right-angle transitional edges between the sidewall 210 and the notched surface 206 or the un-notched surface 208. In this regard, the first transitional surface 214 and/or the second transitional surface 216 may be edges rather than surfaces.

In one embodiment, as illustrated in FIG. 2C an un-notched corner 212a has a symmetric profile such that the notched surface 206 and the un-notched surface 208 are indistinguishable.

Figure 2D:
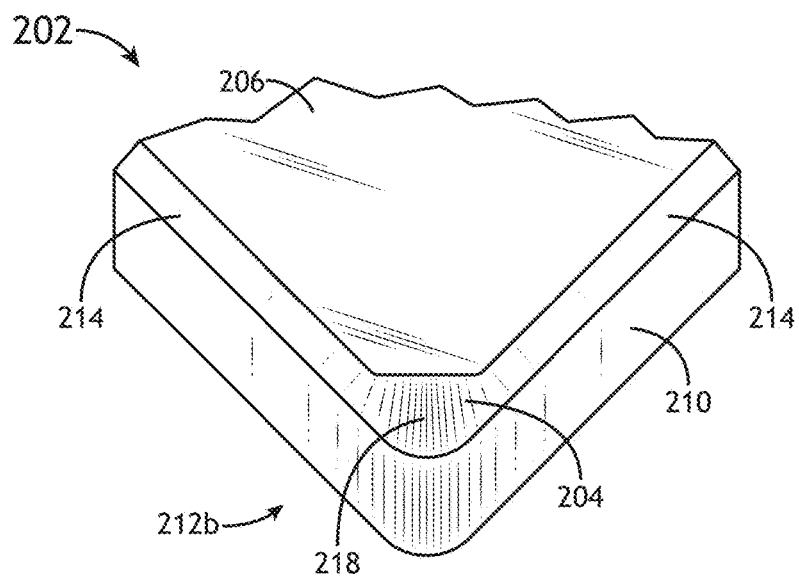
FIG. 2D is an isometric view of a notched corner of a sample, in accordance with one or more embodiments of the present disclosure.
Figure 2E:
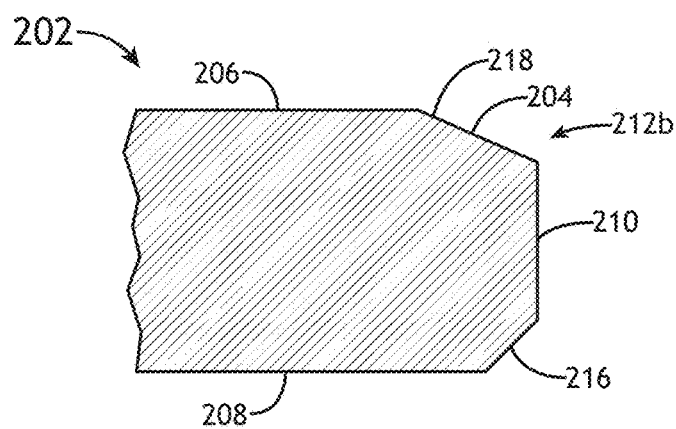
FIG. 2E is a profile view of a notched corner of a sample, in accordance with one or more embodiments of the present disclosure.

FIG. 2D is an isometric view of a notched corner 212b of the sample 202, in accordance with one or more embodiments of the present disclosure. FIG. 2E is a profile view of a notched corner 212b of the sample 202, in accordance with one or more embodiments of the present disclosure. In one embodiment, a notch 204 includes a notch transitional surface 218 forming a transitional surface between the notched surface 206 and the sidewall 210. The notch transitional surface 218 may have any profile that is distinguishable from surrounding transitional surfaces (e.g., the first transitional surface 214 and the second transitional surface 216 of un-notched portions of the sample).

Figure 2F:
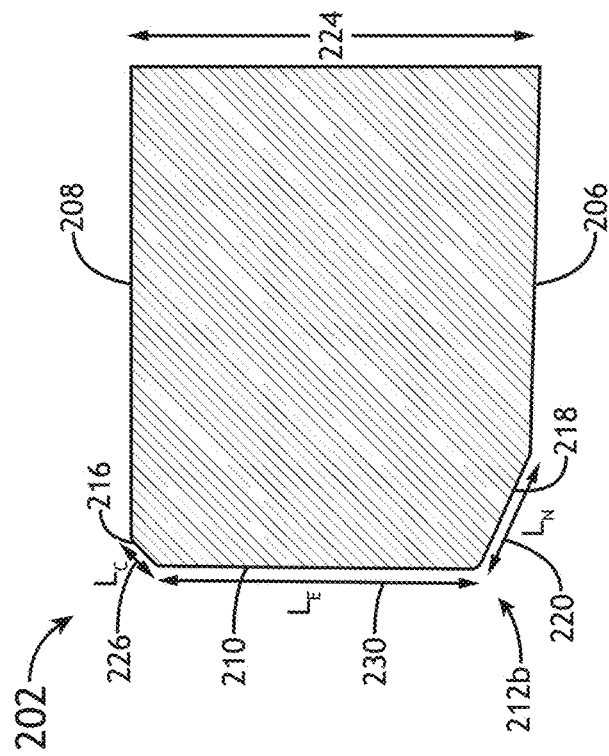
FIG. 2F is a profile view of a notched corner of the sample illustrating transitional slopes, in accordance with one or more embodiments of the present disclosure.
Figure 2G:
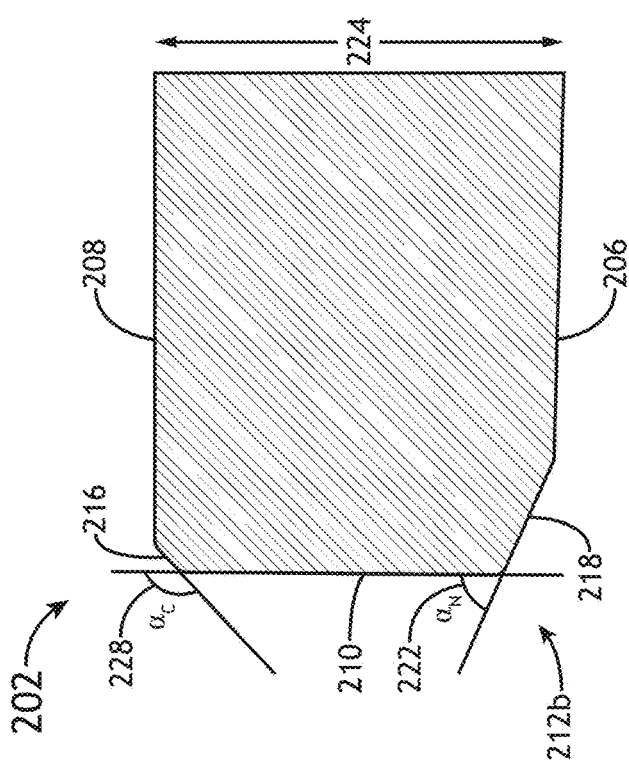
FIG. 2G is a profile view of a notched corner of a sample illustrating transitional lengths, in accordance with one or more embodiments of the present disclosure.

FIGS. 2F and 2G illustrate measurable characteristics of transitional surfaces suitable for notch detection. FIG. 2F is a profile view of a notched corner 212b of the sample 202 illustrating transitional slopes, in accordance with one or more embodiments of the present disclosure. FIG. 2G is a profile view of a notched corner 212b of the sample 202 illustrating transitional lengths, in accordance with one or more embodiments of the present disclosure.

In one embodiment, the notch 204 is formed with known specifications (e.g., notch specifications). The notch specifications may thus specify selected values or ranges of values for characteristics of the notch 204. For example, the notch specifications may specify an allowable value or range of values for the notch length ($L_N$) 220 representing a length of the notch transitional surface 218 in a profile view. By way of another example, the notch specifications may specify an allowable value or range of values for the notch slope 222 ($\alpha_N$) (e.g., a slope of the notch transitional surface 218 with respect to the notched surface 206).

In one embodiment, the sample 202 is formed according to a standard that defines allowable specifications for any aspect of the sample 202. It is recognized herein that standards are commonly used in the semiconductor industry to provide compatibility of a particular type of sample with fabrication tools, transport devices, and the like. For example, photomasks may be, but are not required to be, formed according to the SEMI standard P1-0708E providing general requirements of the glass substrate for hard surface photomasks up to 7 inches in length.

A standard (e.g., SEMI standard P1-0708E, or the like) may provide allowable values or ranges of values for un-notched regions of the sample 202. For example, a standard may specify an allowable value or range of values for a sample thickness 224. By way of another example, a standard may specify an allowable value or range of values for a transitional length ($L_C$) 226 of a transitional surface (e.g., the first transitional surface 214 and/or the second transitional surface 216). By way of another example, a standard may specify an allowable value or range of values for a transitional slope 228 ($\alpha_C$) (e.g., the slope of the first transitional surface 214 with respect to the notched surface 206 or the slope of the second transitional surface 216 with the un-notched surface 208). By way of another example, a standard may specify an allowable value or range of values for a sidewall length ($L_E$) 230.

It is to be understood, however, that the depictions of the sample 202 in FIGS. 2A through 2E and the associated descriptions above are provided solely for illustrative purposes and should not be interpreted as limiting. For example, the sample 202 may include any number of notches 204. Further, notches 204 may be formed on any number of corners 212. In one embodiment, the sample 202 is cylindrical (e.g., the notched surface 206 and the un-notched surface 208 are circular). In this regard, the sample 202 may include any number of notches 204 along the perimeter of the notched surface 206.

Figure 3:
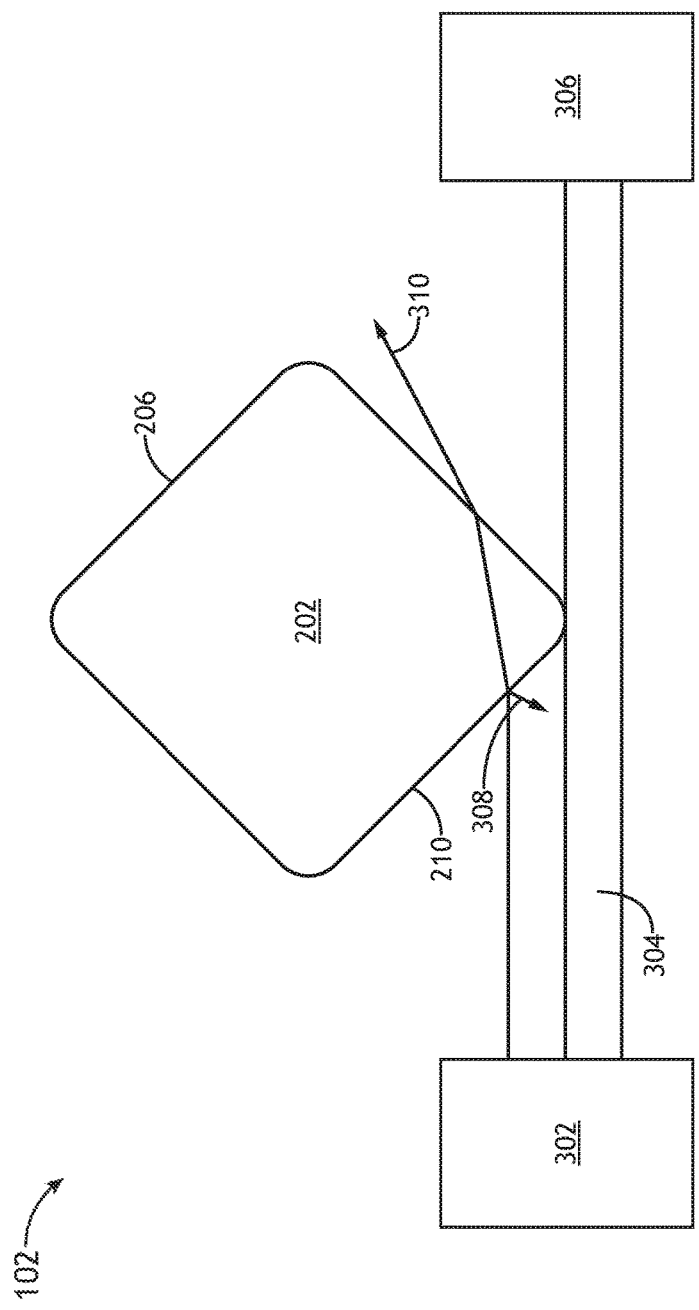
FIG. 3 is a conceptual top view of a notch detection system, in accordance with one or more embodiments of the present disclosure.

FIG. 3 is a conceptual top view of a notch detection system 102, in accordance with one or more embodiments of the present disclosure. In one embodiment, the notch detection system 102 includes an illumination source 302 to generate illumination 304 and a detector 306 configured to generate an image of a portion of sample 202 (e.g., a corner 212, or the like) illuminated by the illumination source 302.

The illumination source 302, the sample 202, and the detector 306 may be arranged in any configuration suitable for generating profile images of the sample 202. In one embodiment, the sample 202 is positioned between the illumination source 302 and the detector 306 to provide a high-contrast profile image. For example, the sample 202 may be positioned such that illumination 304 from the illumination source 302 is incident on the sidewall 210. In this arrangement, illumination 304 from the illumination source 302 that is not incident on the sample 202 may be captured by the detector 306. However, at least a substantial portion of the illumination 304 incident on the sample 202 (e.g., the sidewall 210) may be prevented from reaching the detector 306. For example, at least a portion 308 of the illumination 304 incident on the sidewall 210 may be absorbed, reflected, and/or scattered away from the detector 306. Additionally, in the case of a transparent sample 202 having a polished sidewall 210 (e.g., a glass photomask, or the like), at least a portion 310 of the illumination 304 incident on the sample 202 may be refracted away from the detector 306. As a result, the detector 306 may generate a high-contrast image of the sample 202. It is recognized herein that a high-contrast image may facilitate robust and accurate determination of whether or not a notch 204 is present in a given image. For example, a high-contrast image may facilitate accurate detection of the contours of the sample 202, may exhibit negligible noise, or the like. Further, a high-contrast image generated in this configuration may, but is not required to, provide a nearly binary image with minimal depth information of the sample 202 with respect to an object plane of the detector 306, which may further facilitate contour detection.

The illumination source 302 may include any type of illumination source known in the art suitable for imaging the sample 202. For example, the illumination source 302 may generate illumination 304 having any number or range of selected wavelengths. Further, the illumination source 302 may generate illumination 304 having any degree of spatial or temporal coherence.

In one embodiment, the illumination source 302 includes a source of incoherent illumination. For example, the illumination source 302 may include, but is not limited to including, one or more light-emitting diodes (LEDs) or one or more filaments. In another embodiment, the illumination source 302 includes a source of spatially and/or temporally coherent illumination. For example, the illumination source 302 may include a laser source such as, but not limited to, a narrowband laser source, a broadband laser source, or a supercontinuum laser source.

Figure 4:
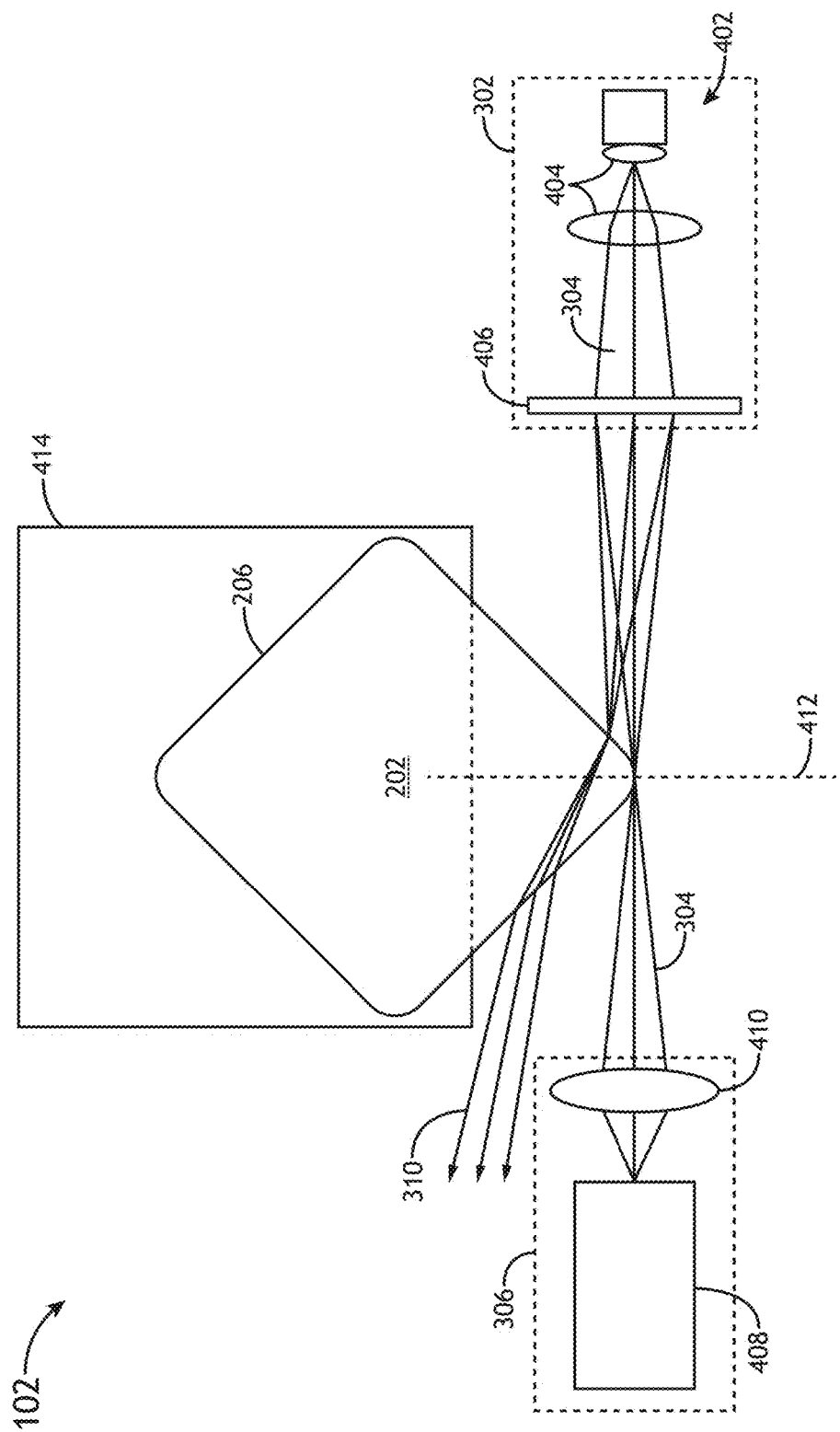
FIG. 4 is a conceptual view of a notch detection system including a diffuse illumination source, in accordance with one or more embodiments of the present disclosure.

FIG. 4 is a conceptual view of a notch detection system 102 including a diffuse illumination source 302, in accordance with one or more embodiments of the present disclosure. The illumination source 302 may provide diffuse illumination 304 to uniformly illuminate the sample 202 during imaging. In one embodiment, the illumination source 302 includes a light source 402 and one or more illuminator lenses 404 to collect and/or shape the illumination 304 from the light source 402. In another embodiment, the illumination source 302 includes a diffuser 406 to scatter the illumination 304 from the illuminator lenses 404 to provide uniform illumination of the sample. Accordingly, the illumination 304 may emerge from the diffuser 406 at a wide range of angles. The diffuser 406 may include any type of element or combination of elements suitable for diffusing incident light. For example, the diffuser 406 may include, but is not limited to, frosted glass or a diffractive optical element.

The detector 306 may include any type of optical detector known in the art suitable for generating an image of the sample 202. For example, a detector 306 may include a sensor array 408 including an array of light-sensitive pixels. The sensor array 408 may include any type of sensor array known in the art such as, but is not limited to, a charge-coupled device (CCD), or a complementary metal-oxide semiconductor (CMOS) device. In another embodiment, the detector 306 includes one or more imaging lenses 410 to image an object plane 412 onto the sensor array 408.

It is recognized herein that the tolerance of the detector 306 to misalignment and/or vibrations of the sample 202 may be influenced by the depth of field of the one or more imaging lenses 410. For example, a misalignment and/or a vibration of the sample 202 beyond the depth of field may result in an out-of-focus image, which may negatively impact any subsequent image processing steps to determine whether or not a notch 204 is present. In one embodiment, the depth of field of the one or more imaging lenses 410 is selected at least in part to be greater than or equal to an expected alignment error of the sample 202. Further, the numerical aperture of the one or more imaging lenses 410 may be selected to provide a selected resolution and field of view.

In another embodiment, the notch detection system 102 includes a stage 414 for securing and positioning the sample 202 at the object plane 412 of the detector 306. The stage 414 may include any type of translation stage known in the art. For example, the stage 414 may include one or more linear translation stages suitable for linear translation of the sample 202 along one or more axes. By way of another example, the stage 414 may include one or more rotation stages suitable for rotating the sample 202 around a rotation axis. In this regard, a rotation stage with a rotation axis aligned with a center of the sample 202 (e.g., a center of the notched surface 206 and/or the un-notched surface 208) may rotate the sample 202 such that selected portions of the sample 202 (e.g., selected corners 212) may be imaged. By way of another example, the stage 414 may include one or more tip and/or tilt stages to modify the orientation of the sample 202. In this regard, the notched surface 206 and the un-notched surface 208 may appear as edges in a profile image of the sample 202. Further, the stage 414 may include any combination of stage types. For example, the stage 414 may include at least one linear translation stage to adjust the position of the sidewall 210 within the field of view of the detector 306, a rotation stage to facilitate the imaging of multiple portions of the sample 202, and/or one or more tip and/or tilt stages to orient the sample 202.

Figure 5:
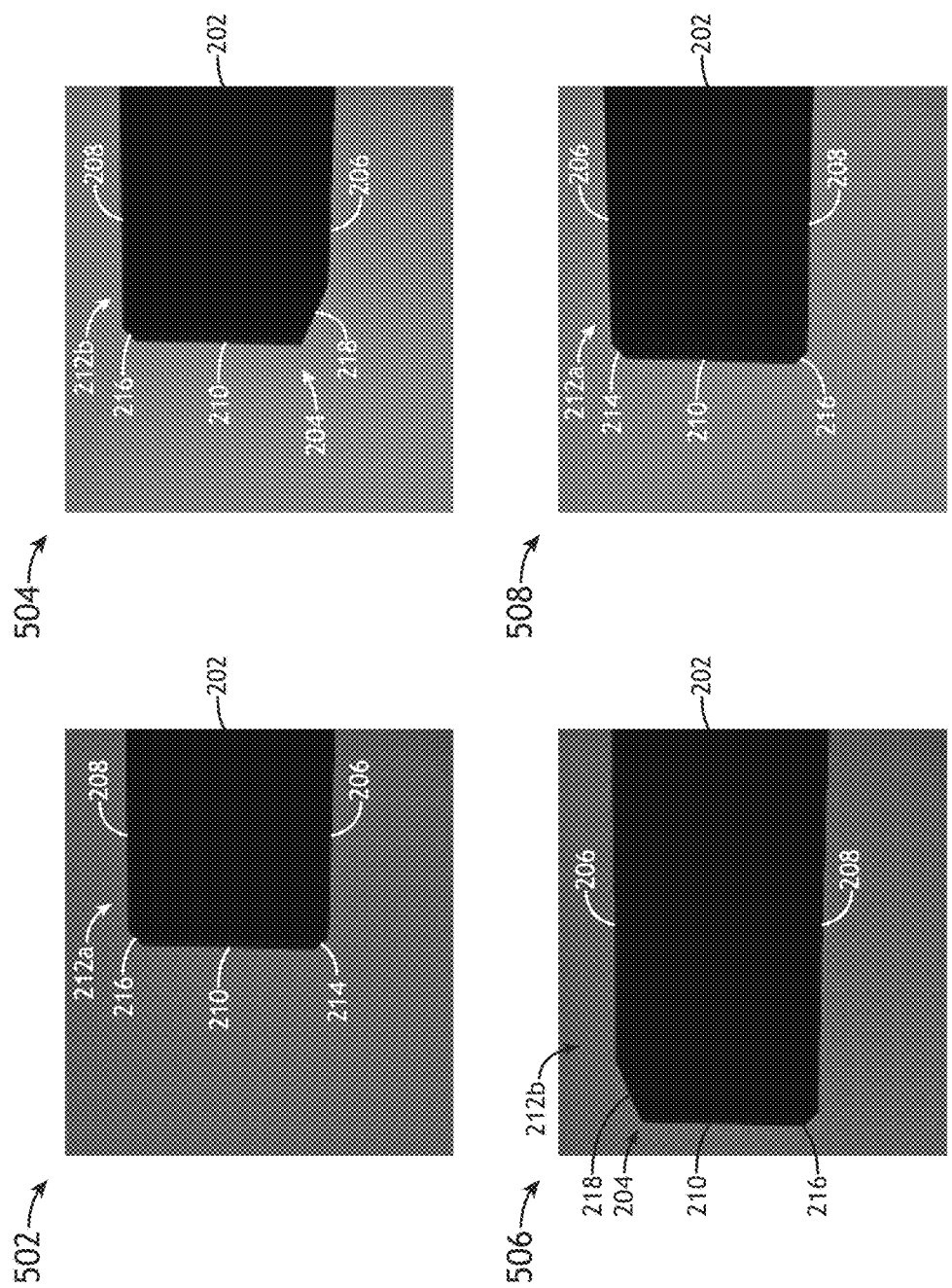
FIG. 5 is a series of profile images of a sample generated by a notch detection system corresponding to the illustration in FIG. 4 in various configurations, in accordance with one or more embodiments of the present disclosure.

FIG. 5 is a series of profile images 502-508 of a sample 202 generated by a notch detection system 102 corresponding to the illustration in FIG. 4 in various configurations, in accordance with one or more embodiments of the present disclosure. Image 502 includes an un-notched corner 212a of an uncoated sample 202 (e.g., a bare sample 202 without a coating or patterns deposited on either the notched surface 206 or the un-notched surface 208). Image 504 includes a notched corner 212b of a sample 202 having a chrome-coated notched surface 206 with the notch 204 facing down in the image. Image 506 includes a notched corner 212b of a sample 202 having a chrome-coated notched surface 206 with the notch 204 facing up in the image. Image 508 includes an un-notched corner 212a of a sample 202 having a chrome-coated notched surface 206.

As illustrated in images 502-508, a notch detection system 102 may provide high-contrast images in which a notch 204, if present, is readily apparent. For example, the portion of the sample 202 in each image is almost nearly black, while the background is significantly lighter in pixel intensity to provide a high contrast between the sample 202 and the background. Further, the pixel intensities associated with the sample exhibit little deviation such that the contours of the sample 202 are sharp.

Further, the images 502-508 illustrate robust imaging with the notch detection system 102. For example, the images 506-508 were obtained using a higher exposure than the images 502-504. However, the contrast between the sample 202 and the background remained high for all of the images 502-508 and the difference in exposure minimally impacts the clarity of the contours of the sample 202. Additionally, the sample 202 was intentionally tilted at a different angle and placed in a different position within the field of view of the detector 306 in each of the images 502-508. Again, the deviations have a negligible impact on the clarity of the contour of the sample 202 and thus on the ability to detect whether or not a notch 204 is present.

Figure 6:
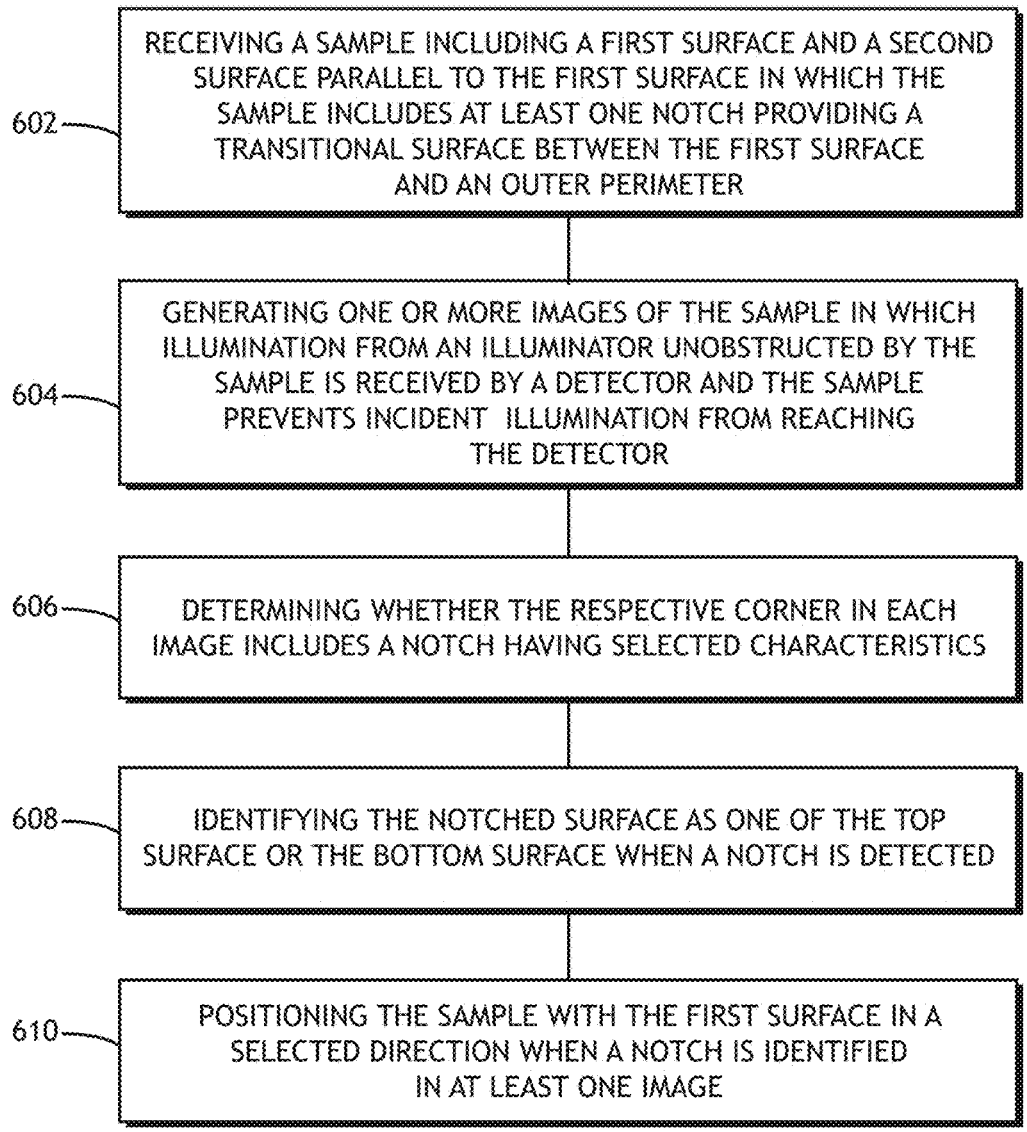
FIG. 6 is a flow diagram illustrating a method for aligning a sample, in accordance with one or more embodiments of the present disclosure.

FIG. 6 is a flow diagram illustrating a method 600 for aligning a sample, in accordance with one or more embodiments of the present disclosure. Applicant notes that the embodiments and enabling technologies described previously herein in the context of sample orientation detection system 100 should be interpreted to extend to method 600. It is further noted, however, that the method 600 is not limited to the architecture of sample orientation detection system 100.

In one embodiment, the method 600 includes a step 602 of receiving a sample 202 including a notched surface 206 and an un-notched surface 208 parallel to the notched surface 206 in which the sample 202 includes at least one notch 204 providing a transitional surface between the notched surface 206 and the sidewall 210 having known notch specifications. As previously described herein, a sample 202 may include one or more identifying notches 204 on one or more corners 212 to identify the notched surface 206. In this regard, the one or more notches 204 may distinguish between the two parallel surfaces. For example, a photomask may typically include identifying notches 204 to identify a patterned surface (e.g., a surface coated with a pattern of chrome features) suitable for exposing a wafer in a lithography process. Further, the photomask may be fabricated such that the patterned surface corresponds to either the notched surface 206 or the un-notched surface 208. Further, the one or more notches 204 may be fabricated with known specifications such that a notch 204 may be identified in a profile image. For example, the notch specifications may specify allowable values or ranges of values for characteristics of the notch 204 such as, but not limited to, notch length 220 or notch slope 222 as previously described herein.

In another embodiment, the method 600 includes a step 604 of generating one or more images of profile views of the sample 202 in which illumination 304 from an illuminator (e.g., the illumination source 302) unobstructed by the sample 202 is received by a detector 306 and the sample 202 prevents incident illumination 304 from reaching the detector 306. For example, as illustrated in FIGS. 3 and 4, the sample 202 may be positioned between an illumination source 302 and a detector 306 such that illumination 304 from the illumination source 302 unobstructed by the sample 202 is received by a detector 306. Further, the sample 202 may at least substantially prevent incident illumination 304 (e.g., illumination 304 incident on the sidewall 210) from reaching the detector 306 through any combination of absorption, reflection, scattering, or refraction. Accordingly, an image generated by the detector 306 may have a high contrast in which the sample 202 is sharply distinguished from the background.

In another embodiment, the sample 202 is positioned (e.g., with the stage 414) such that illumination 304 from the illumination source 302 is incident on the sidewall 210 to generate a profile image. Further, the tip and tilt of the sample 202 may be adjusted (e.g., with the stage 414) such that the notched surface 206 and the un-notched surface 208 are orthogonal to the object plane 412. Accordingly, each image will include a portion of the sidewall 210, as well as top and bottom edges corresponding to the notched surface 206 and the un-notched surface 208. However, the orientation of the notched surface 206 may be unknown at the time of imaging such that the notched surface 206 may correspond to either the top edge or the bottom edge.

Figure 7:
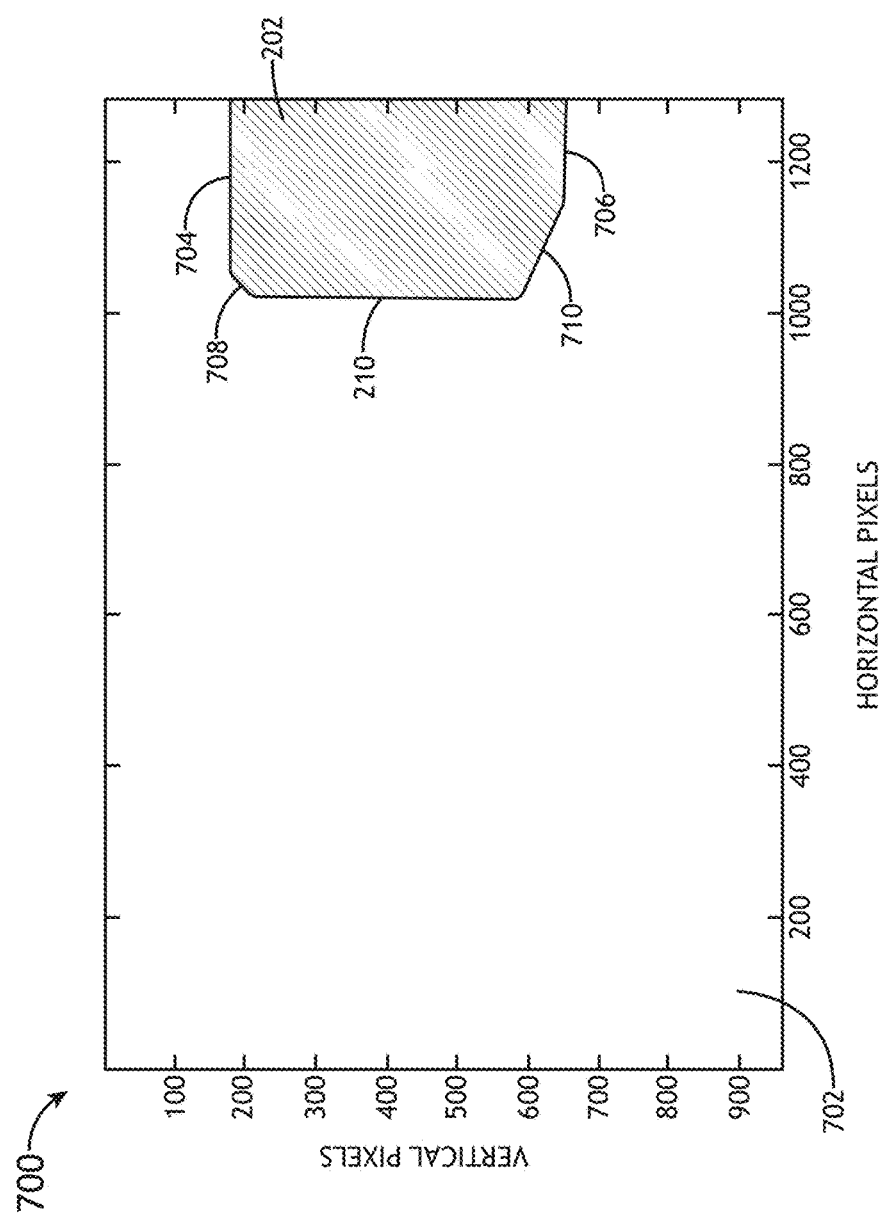
FIG. 7 is an image of a corner of a sample, in accordance with one or more embodiments of the present disclosure.

FIG. 7 is an image 700 of a corner 212 of a sample 202, in accordance with one or more embodiments of the present disclosure. The image 700 exhibits high contrast between the sample 202 and the background 702. Further, the image 700 is oriented such that a top edge 704 and a bottom edge 706 are aligned along the horizontal axis of the image 700, while the sidewall 210 is aligned along the vertical axis of the image 700.

Further, it is to be understood that the terms "top edge" and "bottom edge" are used in the present disclosure merely to differentiate between two parallel edges in an image and should not be interpreted as limiting. For example, a "top edge" may be shown as being above a "bottom edge" in some figures throughout the present disclosure. However, it is recognized herein that images may be rotated and/or represented in any manner without loss of information. Accordingly, an image may be rotated such that a "top edge" and a "bottom edge" are in any orientation without loss of generality.

In one embodiment, multiple images of the sample 202 are generated by rotating the sample 202 (e.g., with the stage 414) such that desired portions of the sample (e.g., corners 212) are in the object plane 412 of the detector 306.

In another embodiment, the method 600 includes a step 606 of determining whether the respective corner in each image includes a notch 204 having the known notch specifications. For example, step 606 may include determining a threshold question of whether or not the respective portion of the sample 202 in the image includes a notch 204.

In one embodiment, step 606 includes identifying a top transitional edge 708 between the sidewall 210 and the top edge 704 as well as a bottom transitional edge 710 between the sidewall 210 and the bottom edge 706. Further, step 606 may include comparing one or more characteristics of the top transitional edge 708 and the bottom transitional edge 710 to the known notch specifications. A notch 204 may thus be identified when either the top transitional edge 708 or the bottom transitional edge 710 matches the known notch specifications.

For example, as previously described herein, a notch specification may include a range of values of the notch length 220, the notch slope 222, or the like. Further, it may be the case that the sample 202 may be fabricated with known dimensions (e.g., known based on metrology and/or a standard). For example, allowable values of the sample thickness 224, the sidewall length 230, the transitional length 226 for un-notched portions of the sample 202, the transitional slope 228 for un-notched portions of the sample 202, or the like may be known or derived from a standard. Accordingly, the known values from the standard may be used to further identify a notch 204 in an image.

In one embodiment, step 606 includes measuring the lengths of the top transitional edge 708 (e.g., a top transitional length) and the bottom transitional edge 710 (e.g., a bottom transitional length) for each image. Accordingly, a notch 204 may be identified if the length of either the top transitional edge 708 or the bottom transitional edge 710 falls within an allowable notch length as defined by known notch specifications.

In another embodiment, step 606 includes measuring a slope of the top transitional edge 708 (e.g., a top transitional slope) and a slope of the bottom transitional edge 710 (e.g., a top transitional slope) for each image. Accordingly, a notch may be identified if either the top transitional slope or the bottom transitional slope falls within an allowable notch slope as defined by known notch specifications.

The one or more characteristics of the top transitional edge 708 and the bottom transitional edge 710 used to determine whether a notch 204 is present (e.g., the lengths, slopes, or the like) may be measured by any method known in the art. For example, the one ore characteristics of the top transitional edge 708 and the bottom transitional edge 710 may be measured using one or more image processing steps including, but not limited to, one or more edge detection steps to identify the top transitional edge 708 and the bottom transitional edge 710 in an image. Further, once the top transitional edge 708 and the bottom transitional edge 710 are identified in an image, the selected characteristics may be extracted from the image. In addition, the selected characteristics may be expressed in physical units (e.g., metric units of length, or the like) provided that the image is calibrated to provide a conversion between pixels and the physical units.

Figure 8A:
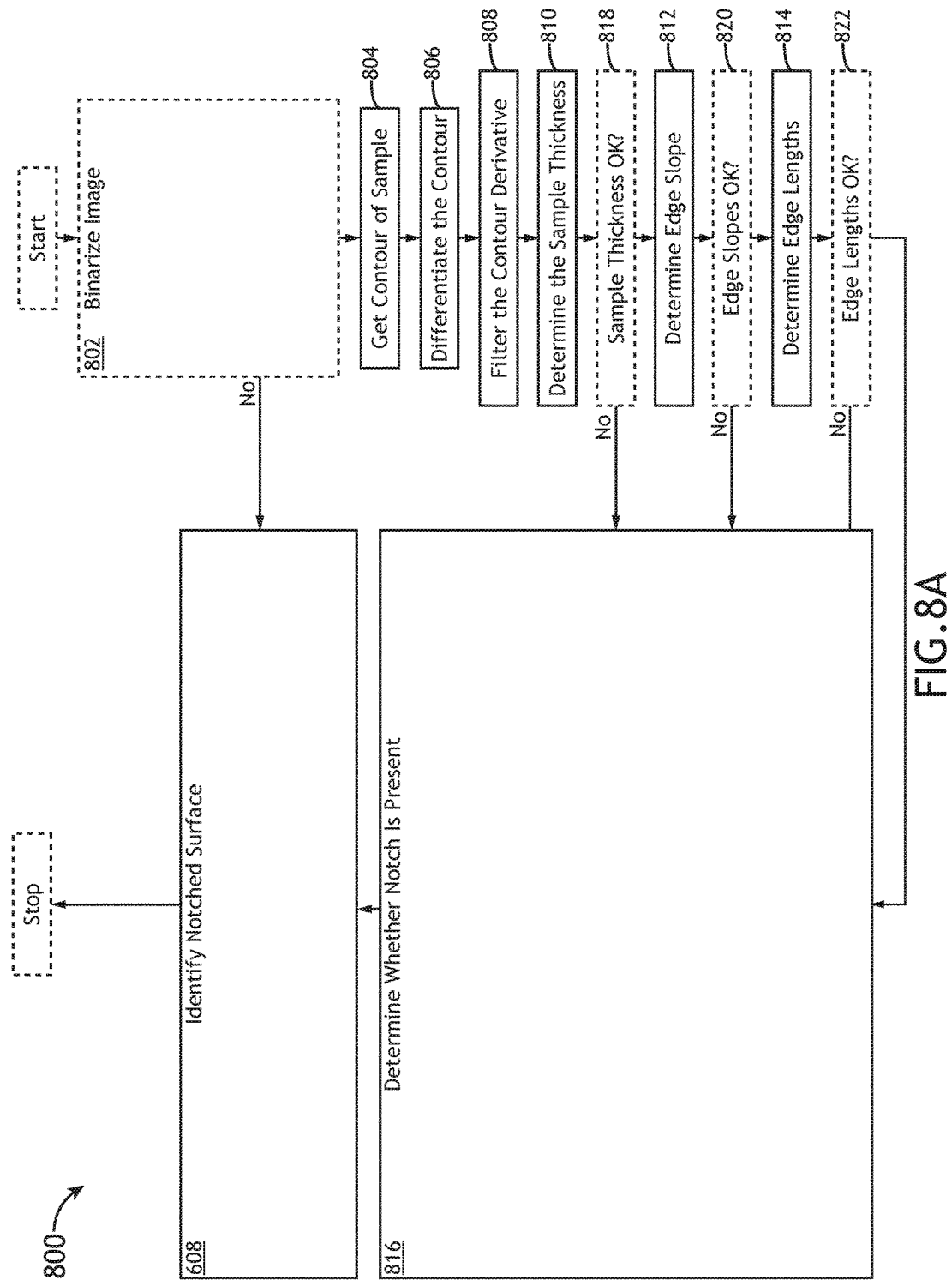
FIG. 8A is a flow diagram illustrating sub-steps for identifying whether or not a notch is present in an image, in accordance with one or more embodiments of the present disclosure.

FIG. 8A is a flow diagram 800 illustrating sub-steps for identifying whether or not a notch 204 is present in an image generated in step 604, in accordance with one or more embodiments of the present disclosure.

In one embodiment, step 606 includes a sub-step 802 of binarizing at least one image generated in step 604. For example, the sub-step 802 may include converting an image generated in step 604 (e.g., image 700, or the like) to a binary image having only two pixel values (e.g., a "1," or a "0"). Accordingly, pixels associated with the sample 202 may have a first binary value (e.g., a "0") and pixels associated with the background (e.g., background 702) may have a second binary value (e.g., a "1").

A binarized image may be generated using a variety of methods. For example, a sub-step 802 may include determining a threshold value between pixels associated with the sample and pixels associated with the background. Accordingly, pixels having values below the threshold may be adjusted to the first binary value and pixels having values above the threshold may be adjusted to the second binary value.

FIG. 9A includes a binary image 902 generated from the image 700 of FIG. 7, in accordance with one or more embodiments of the present disclosure. In image 902, pixels associated with the sample 202 have a value of "0" and are shown as black, while pixels associated with the background 702 have a value of "1" and are shown as white.

In one embodiment, sub-step 802 includes generating 802a a binarization threshold binarizing an image (e.g., an image generated in step 604). For example, binarizing the image may include generating 802b a binary image in which pixels of the input image (e.g., image 902, or the like) are having values less than the binarization threshold modified to a first binary value (e.g., "0") and pixels having values greater than the binarization threshold are modified to a second binary value (e.g., "1").

The binarization threshold may be determined using any method known in the art. In one embodiment, the binarization threshold may be preselected (e.g., prior to generating images in step 604). In this regard, the binarization threshold may be, but is not required to be, preselected based on historical images taken with a particular notch detection system 102. In another embodiment, an image-specific to the binarization threshold is determined by analyzing the pixel values of a captured image. For example, sub-step 802 may include generating 802c a histogram of pixel values in an image (or a selected portion of an image). A high-contrast image of a sample 202 generated by a notch detection system 102 may include two primary peaks: one peak including pixels associated with the sample 202 and one peak associated with pixels from the background. Further, the sub-step 802 may include selecting the binarization threshold as a pixel value falling between the two peaks. In this regard, pixels associated with the sample 202 may be assigned the first binary value and pixels associated with the background may be assigned the second binary value.

It is recognized herein that the degree of contrast of a captured image will be reflected in the histogram. For example, a high contrast image taken with the notch detection system 102 may exhibit sharp peaks with a clear separation between pixel values associated with the sample 202 and the background. However, as the image contrast decreases, the peaks may become shorter and wider. In some low-contrast images, the peaks may overlap, which would negatively impact the ability to distinguish the sample from the background.

FIG. 9B includes a histogram 904 of pixel values of image 700 of FIG. 7, in accordance with one or more embodiments of the present disclosure. The histogram 904 includes two sharp peaks: a first peak 906 at a pixel value of approximately 5 associated with the sample 202 and a second peak 908 at a pixel value of approximately 135 associated with the background 702. The first peak 906 and the second peak 908 do not overlap such that a binarization threshold between the peaks (e.g., in the range from approximately 25-110) may be selected.

In one embodiment, sub-step 802 may check 802d the contrast to ensure that a proper image has been generated based on selected criteria such as, but not limited to, "distance" in pixel values between peaks relative to a selected specification, a number of peaks, a strength of the peaks, or the like. In the case that an image does not meet selected specifications, an error may be generated. Further, an additional image may be taken under new conditions (e.g., increased illumination, modified alignment of the sample 202, or the like).

In another embodiment, step 606 includes a substep 804 of generating a contour image of the sample 202. For example, a contour image may be generated in which a contour of the sample 202 has a first binary value (e.g., a "1") and the remainder of the pixels have a second binary value (e.g., a "0").

A contour image may be generated using any method known in the art. For example, the contour image may be determined using an edge detection algorithm. In one embodiment, the contour image of the sample 202 is generated by differentiating the binary image of sub-step 802 (e.g., image 902 of FIG. 9A) along the horizontal direction (e.g., as defined by the image 902 of FIG. 9A). Subsequently, the pixel in each row having the maximum derivative value may be registered as a point on the contour and set to the first binary value, while the remainder of the pixels may be set to the second binary value.

Figure 10:
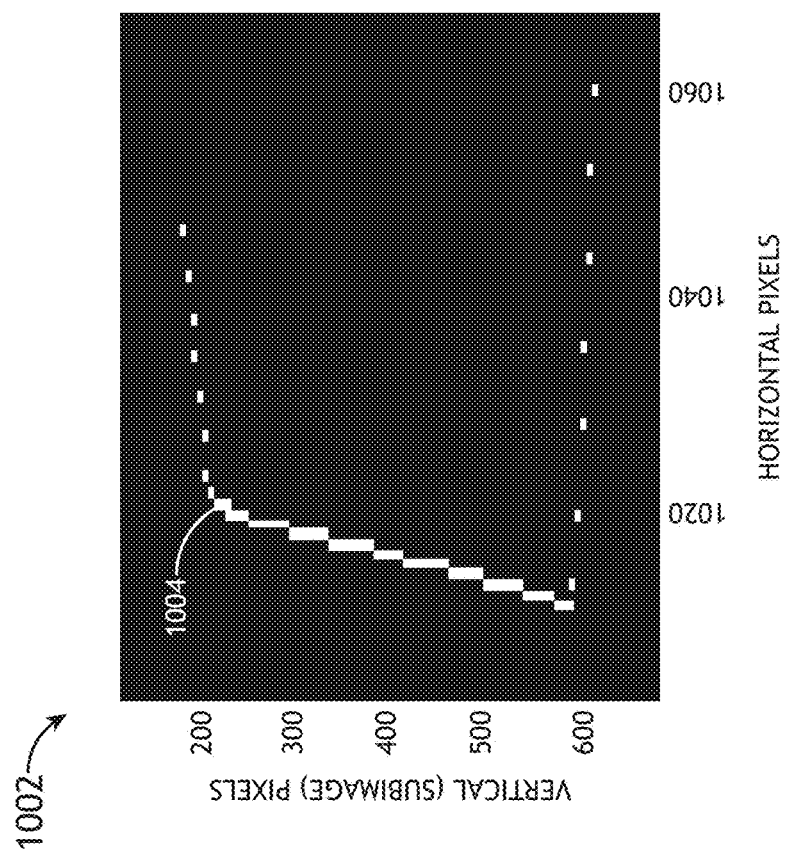
FIG. 10 is a contour image generated based on the image of FIG. 9A, in accordance with one or more embodiments of the present disclosure.

FIG. 10 is a contour image 1002 generated based on the image 902 of FIG. 9A, in accordance with one or more embodiments of the present disclosure. In one embodiment, pixels associated with a contour 1004 of the sample 202 have a value of "1" and appear white, while the remainder of the pixels have a value of "0" and appear black. Further, the image 1002 is generated by performing a derivative of the image 902 of FIG. 9A along the horizontal direction of image 902 and selecting the pixel in each row having the maximum absolute value of the derivative as part of the contour 1004. Further, the image 1002 is generated based on a selected portion (e.g., a "zoomed-in" portion of the image 902 of FIG. 9A) for clarity. It is noted that although the contour in image 902 may appear noncontinuous, the separation between the horizontal pixels along the contour is merely a result of the finite resolution of the image and the pixel size.

Figure 11A:
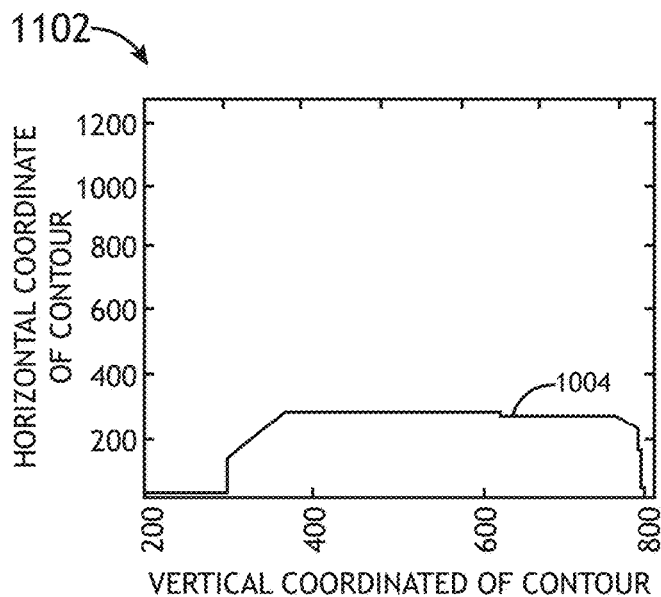
FIG. 11A is an image including a rotated version of the contour of the sample, in accordance with one or more embodiments of the present disclosure.
Figure 11B:
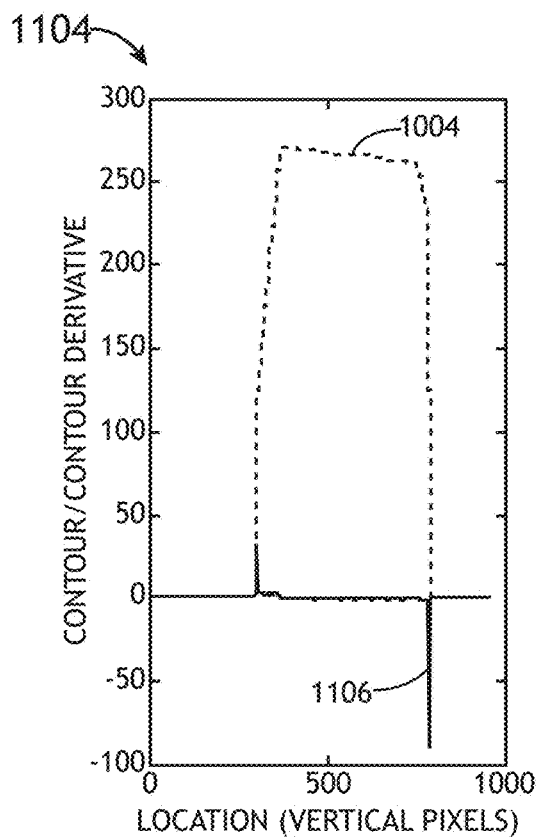
FIG. 11B is a plot including a contour of a sample as well as a contour derivative based on the image of FIG. 11A, in accordance with one or more embodiments of the present disclosure.

In another embodiment, step 606 includes a substep 806 of differentiating the contour 1004 of the sample 202 to generate a contour derivative. For example, the contour derivative may include the slope of each edge of the contour 1004 and thus the slope of each surface of the sample 202 (e.g., in units of pixels). FIG. 11A is an image 1102 including a rotated version of the contour 1004 of the sample 202, in accordance with one or more embodiments of the present disclosure. Pixels of the contour 1004 are shown with a value of "0" and appear black, while the remainder of the pixels are shown with a value of "1" and appear white. In this regard, image 1102 may represent a rotated and transposed version of the full-size image upon which image 1002 of FIG. 10 is based. FIG. 11B is a plot 1104 including the contour 1004 of the sample 202 as well as a contour derivative 1106 (e.g., a derivative of the contour 1004) based on the image 1102 of FIG. 11A, in accordance with one or more embodiments of the present disclosure.

Figure 11C:
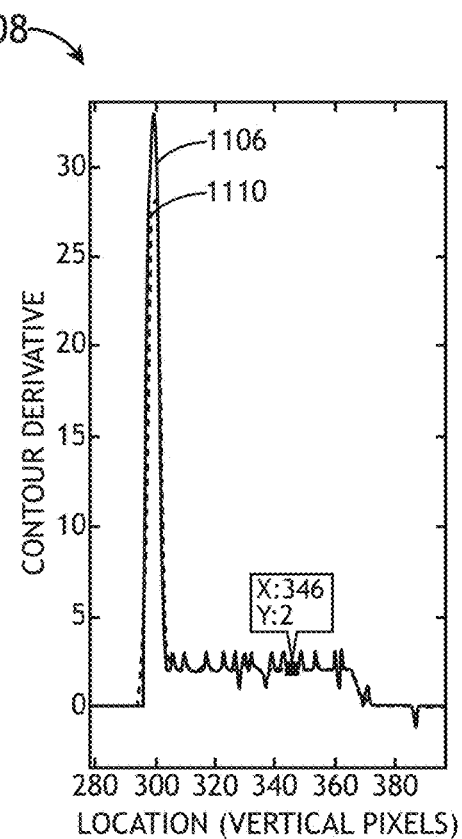
FIG. 11C includes a plot with a portion of a contour derivative overlaid with a filtered contour derivative, in accordance with one or more embodiments of the present disclosure.

In another embodiment, step 606 includes a substep 808 of filtering the contour derivative 1106. It may be the case that the contour derivative 1106 includes noise. Accordingly, the contour derivative 1106 may be filtered and/or smoothed using any technique known in the art to reduce the noise in the contour derivative 1106. FIG. 11C includes a plot 1108 with a portion of the contour derivative 1106 overlaid with a filtered contour derivative 1110, in accordance with one or more embodiments of the present disclosure. The plot 1108 includes a subset of pixels associated with the bottom edge 706 and the bottom transitional edge 710 from image 1102.

Differentiating the contour 1004 of the sample 202 may facilitate the efficient and robust measurement of relevant parameters of the contour 1004 of the sample 202 such as, but not limited to, the sample thickness 224, the sidewall length 230, the top and bottom transitional slopes (e.g., corresponding to the transitional slope 228 and/or the notch slope 222), or the top and bottom transitional lengths (e.g., corresponding to the transitional length 226 and/or the notch length 220).

In another embodiment, step 606 includes a substep 810 of determining the sample thickness 224.

For example, the sample thickness 224 may be measured based on the pixel distance between the maximum and the minimum values of the contour derivative 1106, which correspond to the bottom edge 706 and the top edge 704, respectively. Further, the physical sample thickness 224 (e.g., in metric units of length, or the like) may be determined provided that the images generated in step 604 are calibrated to provide a conversion between pixels and physical length in the horizontal and vertical directions of the image. For instance, the physical sample thickness 224 may be determined by multiplying the number of pixels between the maximum and minimum values of the contour derivative 1106 by a calibrated pixel size (e.g., a pixel size at the object plane 412) along the horizontal direction as defined by the image 1102 of FIG. 11A. It is noted that the image 1102 of FIG. 11A is rotated with respect to the image 700 of FIG. 7 generated in step 604 such that the calibrated pixel size along the horizontal direction of FIG. 11A corresponds to the calibrated pixel size along the vertical direction of FIG. 7.

In another embodiment, step 606 includes a substep 812 of determining the slopes of edges of the contour 1004. For example, substep 812 may include determining the slopes of the sidewall 210, the top transitional edge 708, the bottom transitional edge 710, or the like.

The contour derivative 1106 (and/or the filtered contour derivative 1110) may include sequential groups of pixels having approximately equal values that represent the slopes of edges of the contour 1004 and thus the slopes of the surfaces of the sample 202. For example, adjacent pixels along a contour having approximately the same slope may be associated with a common surface of the sample 202. For instance, plot 1108 illustrates a series of pixels near the peak of the contour derivative 1106 (e.g., having the maximum positive derivative) associated with the bottom edge 706 followed by a series of pixels having a value of approximately two that is associated with the slope of the bottom transitional edge 710.

Accordingly, slopes of each edge of the contour 1004 (e.g., the bottom edge 706, the bottom transitional edge 710, the sidewall 210, the top transitional edge 708, and the top edge 704) may be found by determining a representative value for each group of pixels (e.g., an average pixel value of each group, a median value of each group, or the like). Further, the representative pixel values for each group may be determined based on either the contour derivative 1106 or the filtered contour derivative 1110. The slopes of each edge of the contour may additionally be converted to physical units (e.g., metric units of length) provided that the size of the pixels is known.

Further, the slopes of the top transitional edge 708 and the bottom transitional edge 710 may be corrected for any tilt or leveling errors by subtracting the slope of the sidewall 210.

The groups of pixels in the filtered contour derivative 1110 having approximately equal values may be identified using any method known in the art. In one embodiment, at least one pixel associated within each group is identified. Subsequently, all pixels associated with the surface may be determined by searching for pixels having the same value of the filtered contour derivative 1110 within a selected tolerance.

In another embodiment, the pixel group associated with the sidewall 210 is found first and a representative value of the slope of the sidewall 210 is subtracted from the filtered contour derivative 1110 to correct for any tip/tilt of the sample 202. Subsequently, pixels having positive values of the filtered contour derivative 1110 that are below a maximum allowable slope may be associated with the bottom transitional edge 710. Similarly, pixels having negative values of the filtered contour derivative 1110 that are above a minimum allowable slope may be associated with the top transitional edge 708. The maximum and minimum allowable slopes may be determined using multiple methods. For example, the maximum and minimum allowable slopes may be known based on a standard governing the dimensions of the sample 202. By way of another example, the maximum and minimum allowable slopes may be selected to be slightly lower than the maximum measured slope and slightly higher than the minimum measured slope in the filtered contour derivative 1110.

The group of pixels associated with the sidewall 210 may be identified by any method known in the art. For example, it may be the case that the center pixel (e.g., a pixel halfway between pixels having the maximum and minimum values of the filtered contour derivative 1110) is known to be associated with the sidewall 210. For instance, it may be the case that samples fabricated according to a known specification have transitional edges (e.g., chamfers, bevels, or notches) that do not extend to the midpoint of the sidewall 210 between the notched surface 206 and the un-notched surface 208.

By way of another example, pixels associated with the sidewall 210 may be determined by sequentially comparing the values of the filtered contour derivative 1110 for symmetric pixel pairs. For instance, a first pair of symmetric pixels may include the pixels of the filtered contour derivative 1110 having the maximum and minimum values, which correspond to the bottom edge 706 and the top edge 704, respectively. The second pair of symmetric pixels may include the next pixels toward the center in each direction, and so on. At some point, the values of the filtered contour derivative 1110 of the pixel pair will be equal (e.g., within a specified tolerance). These pixels may then be attributed to the sidewall 210. Further, all pixels with the same value of the filtered contour derivative 1110 with a selected tolerance may then be associated with the sidewall 210.

In another embodiment, step 606 includes a substep 814 of determining lengths of the edges of the contour 1004 based on the number of pixels in the respective pixel groups. For example, substep 812 may include determining the lengths of the sidewall 210, the top transitional edge 708, the bottom transitional edge 710, or the like.

For instance, the length of an edge in units of pixels may be described as $L=n\sqrt{1+s^2}$, where n is the number of pixels in a pixel group and s is the representative value of the pixel group (e.g., a value of the filtered contour derivative 1110 representing a slope of a corresponding edge). Further, the length of the edge may be expressed in physical units (e.g., metric units of length, or the like) provided that the image is calibrated to provide a conversion between pixels and physical length in the horizontal and vertical directions of the image (e.g., the magnification of the notch detection system 102 is known).

In another embodiment, step 606 includes a substep 816 of determining whether a notch 204 is present based on the slopes and/or the lengths of the top transitional edge 708 and the bottom transitional edge 710. For example, the slopes and/or the lengths of the top transitional edge 708 and the bottom transitional edge 710 may be compared known notch specifications including known notch slopes and/or notch lengths. A notch 204 may thus be identified when the slope and/or the length of either the top transitional edge 708 or the bottom transitional edge 710 are within an allowable range of notch lengths.

In another embodiment, a notch 204 is identified based on multiple criteria. For example, a notch 204 may be identified when both a slope and a length of either of the top transitional edge 708 or the bottom transitional edge 710 are within allowable ranges based on the known notch specifications.

In another embodiment, step 606 includes one or more error check steps. For example, step 606 may include a substep 818 to check the sample thickness 224 against allowable values. By way of another example, step 606 may include a substep 820 to check the edge slopes (e.g., the sidewall 210, the top transitional edge 708, the bottom transitional edge 710, or the like) against allowable values. By way of another example, step 606 may include a substep 822 to check edge lengths (e.g., the sidewall 210, the top transitional edge 708, the bottom transitional edge 710, or the like) against allowable values.

For instance, the allowable values may be, but are not required to be, determined based on a standard (e.g., the SEMI standard P1-0708E may provide general requirements of the glass substrate for hard surface photomasks up to 7 inches in length). In the case of an error, the method 600 may include generating one or more error flags. By way of another example, an error (and an associated error flag) may be generated when both the top transitional edge 708 and the bottom transitional edge 710 meet the specifications for a notch 204. For instance, a sample 202 may be designed to include notches 204 on only one surface. In such a case, a notch 204 may not be properly identified.

Referring again to FIG. 6, in another embodiment, the method 600 includes a step 608 of identifying the notched surface as one of the top surface or the bottom surface when a notch is detected. For example, when the top transitional edge 708 meets the required notch specifications, the top edge 704 may be identified as the notched surface 206 and the top edge 704 may be identified as the un-notched surface 208. Conversely, when the bottom transitional edge 710 meets the required notch specifications, the bottom edge 706 may be identified as the notched surface 206 and the top edge 704 may be identified as the un-notched surface 208.

In one embodiment, the step 608 includes generating an output flag with a result of the notch detection. The output flag may include any type of indicator of an output result. For example, the output flag may include one or more numerical values indicative of an outcome of the notch detection.

Figure 8B:
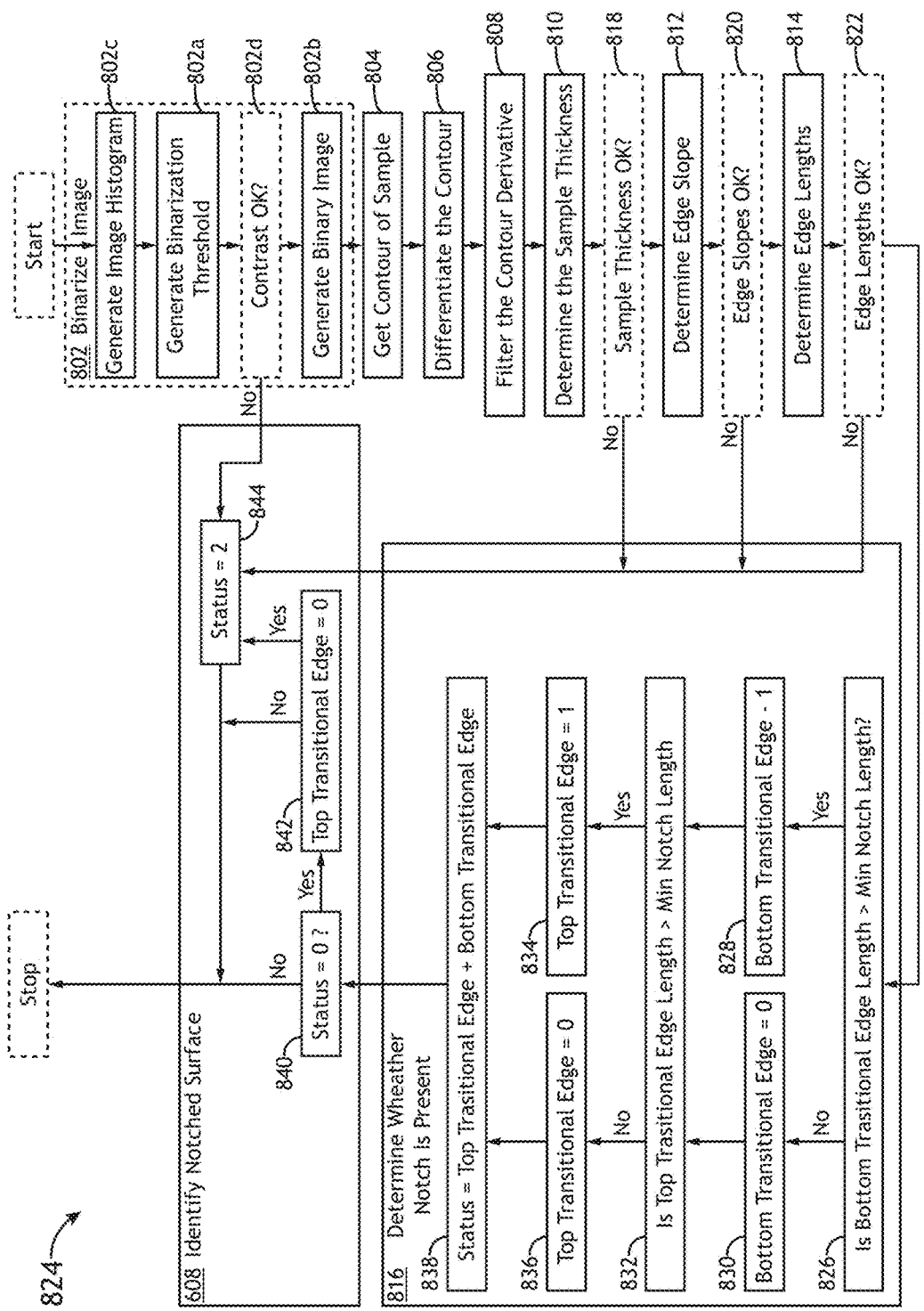
FIG. 8B is a flow diagram illustrating the generation of numerical flags indicative of an outcome of the notch detection, in accordance with one or more embodiments of the present disclosure.

FIG. 8B is a flow diagram 824 illustrating the generation of numerical flags indicative of an outcome of the notch detection, in accordance with one or more embodiments of the present disclosure.

In one embodiment, the substep 816 includes checking 826 whether the length of the bottom transitional edge 710 is larger than a minimum notch length. If so, the bottom transitional edge 710 is associated with a notch 204 and a variable representing the bottom transitional edge 710 is set 828 to a value of −1. If not, the variable representing the bottom transitional edge 710 is set 830 to a value of 0. The substep 816 may further include checking 832 whether the length of the top transitional edge 708 is larger than a minimum notch length. If so, the top transitional edge 708 is associated with a notch 204 and a variable representing the top transitional edge 708 is set 834 to a value of 1. If not, the variable representing the top transitional edge 708 is set 836 to a value of 0. The substep 816 may further include adding 838 the values of the variables representing the top transitional edge 708 and the bottom transitional edge 710 and setting the result as a status variable. The step 608 may further include checking 840 whether the status variable equals 0. If not, then step 608 outputs a status flag of 0 indicating that the image represents an un-notched corner 212a. If so, then the step 608 may further include checking 842 whether the variable representing the top transitional edge 708 equals 0. If so, then the status flag is set 844 to 2 to indicate an error. If not, then step 608 outputs the current value of the status flag. Accordingly, if the status flag is −1, then the bottom edge 706 corresponds to the notched surface 206. Conversely, if the status flag is 1, then the top edge 704 corresponds to the notched surface 206.

In another embodiment, the method 600 includes a step 610 of positioning the sample with the notched surface in a selected direction when a notch is identified in at least one image. For example, referring back to FIG. 1, the sample positioner 104 may include one or more sample positioning devices suitable for orienting the sample 202 in a selected orientation. For example, the sample positioner 104 may include one or more rotation assemblies to secure the sample 202 and flip the sample 202 as necessary such that the notched surface 206 is oriented in a selected direction (e.g., facing upwards, or the like). By way of another example, the sample positioner 104 may include one or more translation stages (e.g., linear translation stages, rotation stages, tip/tilt stages, or the like) to translate the sample 202 between the stage 414 and the one or more rotation assemblies. By way of another example, the stage 414 may include and/or be integrated with the one or more rotation assemblies.

Figure 12:
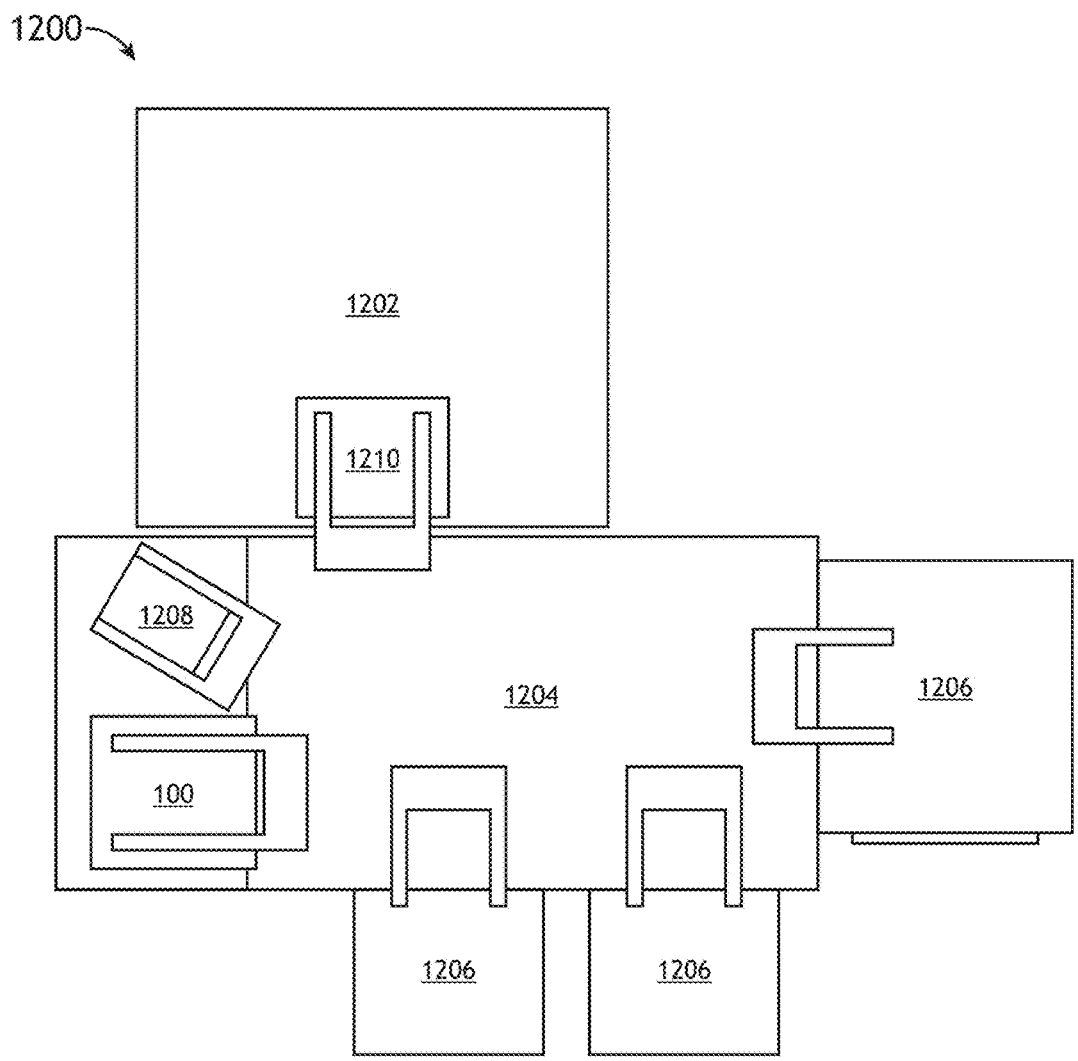
FIG. 12 is a conceptual view of a fabrication assembly including a metrology tool suitable for performing metrology measurements on a sample, in accordance with one or more embodiments of the present disclosure.

The sample orientation detection system 100 may be integrated into one or more external systems. FIG. 12 is a conceptual view of a fabrication assembly 1200 including a metrology tool 1202 suitable for performing metrology measurements on a sample 202 (e.g., a photomask, or the like), in accordance with one or more embodiments of the present disclosure. In another embodiment, the fabrication assembly 1200 includes a sample loader system 1204 (e.g., a robotic system, or the like) for loading a sample 202 in and out of the metrology tool 1202. In another embodiment, the sample loader system 1204 includes one or more receiving pods 1206 for receiving a sample 202 for measurement by the metrology tool 1202 and/or providing the sample 202 to another system after measurement. In another embodiment, the sample loader system 1204 includes one or more buffers 1208 for temporarily storing a sample 202 (e.g., during measurement of another sample 202, or the like). In another embodiment, the sample loader system 1204 includes sample orientation detection system 100. In this regard, the sample orientation detection system 100 may receive a sample 202 in an arbitrary orientation, identify a notched surface 206 with the notch detection system 102, and orient the sample 202 with the notched surface 206 in a selected direction. For example, the sample orientation detection system 100 may orient a photomask to have a coated and/or patterned surface in a selected orientation to avoid damage to the coated and/or patterned surface. Subsequently the sample 202 may be transferred to a loading stage 1210 of the metrology tool 1202 for measurement by the metrology tool 1202.

Figure 13:
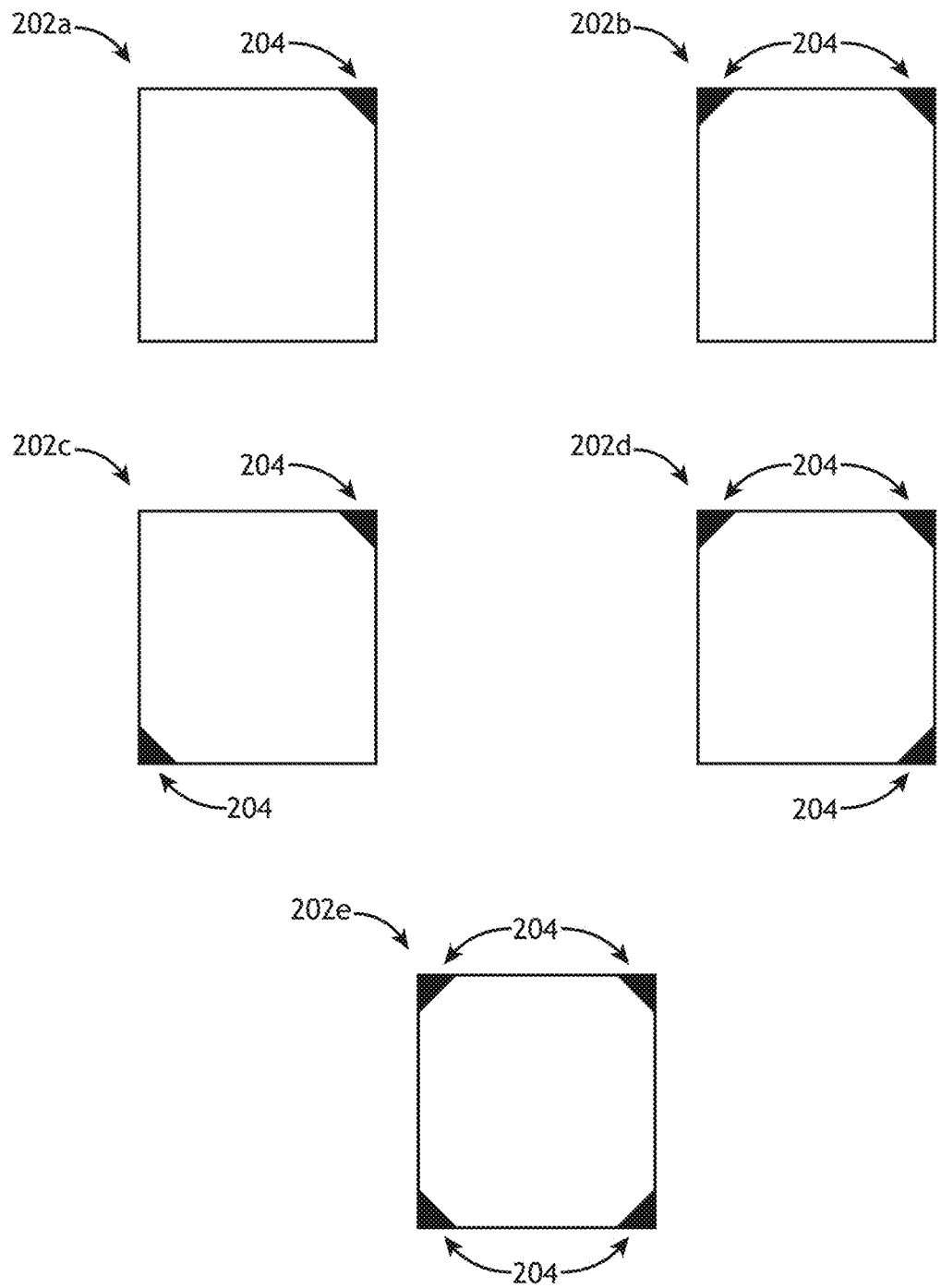
FIG. 13 includes conceptual views of samples having different configurations of notches, in accordance with one or more embodiments of the present disclosure.

Referring now to FIG. 13, the sample orientation detection system 100 may identify and/or classify a sample 202 based on notches 204 identified by the notch detection system 102. FIG. 13 includes conceptual views of samples having different configurations of notches 204, in accordance with one or more embodiments of the present disclosure. For example, a sample 202a may include a single notch 204, a sample 202b may include two notches 204 on adjacent corners, a sample 202c may include two notches 204 on opposing corners, a sample 202d may include three notches 204, and a sample 202e may include four notches 204. Accordingly, it may be the case that the number and/or orientation of notches may be used to classify one or more aspects of the sample 202 such as, but not limited to, the material type. For example, a standard may specify that a sample 202a including a single notch 204 may be formed from a first material or group of materials (e.g., green soda lime, white crown soda lime, quartz, or the like), a sample 202b including two notches 204 on adjacent corners may be formed from a second material or group of materials (e.g., aluminosilicate), a sample 202c including two notches 204 on opposing corners may be formed from a third material or group of materials (e.g., quartz), and a sample 202e including three notches 204 may be formed from a fourth material or group of materials (e.g., borosilicate). However, it is to be understood that the depictions in FIG. 13 are provided solely for illustrative purposes and should not be interpreted as limiting. For example, the number and/or orientation of notches 204 may be indicative of any sample characteristic such as, but not limited to, the type of coating or particular patterns.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A notch detection system, comprising:
 a controller communicatively coupled to an imaging detector, the controller including one or more processors configured to execute program instructions causing the one or more processors to:
  receive one or more images of a sample from the imaging detector, wherein the sample includes a notched surface and an un-notched surface parallel to the notched surface, wherein the notched surface and the un-notched surface are bounded by a sidewall, wherein the sample includes at least one notch providing a transitional surface between the notched surface and the sidewall having known notch specifications, wherein each image of the one or more images includes a profile view of a respective corner of the sample, the profile view including at least a portion of the sidewall and top and bottom edges associated with the notched surface and the un-notched surface, wherein illumination from an illuminator unobstructed by the sample is received by the detector, wherein the sample prevents illumination from the illuminator incident on the sidewall from reaching the detector;
  determine whether the respective corner in each image of the one or more images includes a notch, wherein the notch is identifiable as a transitional edge between one of the top surface or the bottom surface and the sidewall having the known notch specifications;
  identify the notched surface as one of the top surface or the bottom surface when a notch is detected; and
  direct a sample positioner to position the sample with the notched surface in a selected direction when a notch is identified in at least one image of the one or more images.

2. The notch detection system of claim 1, wherein the sample includes a film deposited on the un-notched surface.

3. The notch detection system of claim 1, wherein the sample comprises:
 a photomask.

4. The notch detection system of claim 1, wherein the one or more processors are further configured to execute program instructions causing the one or more processors to:
 insert the sample in a fabrication tool with the notched surface in the selected direction when a notch is identified in at least one image of the one or more images.

5. The notch detection system of claim 4, wherein the fabrication tool comprises:
 at least one of a metrology tool or a lithography tool.

6. The notch detection system of claim 1, wherein the one or more processors are further configured to execute program instructions causing the one or more processors to:
 determine one or more characteristics of the sample based on at least one of a number or a distribution of notches identified on the sample in the one or more images.

7. The notch detection system of claim 6, wherein the one or more characteristics comprise:
 a composition of a substrate of the sample.

8. The notch detection system of claim 6, wherein the one or more characteristics comprise:
 a composition of a film on a surface of the sample.

9. The notch detection system of claim 1, wherein the known notch specifications include a range of notch lengths, wherein determining whether the respective corner in each image of the one or more images includes a notch comprises:
 measuring a first transition length and a second transition length in each image of the one or more images, wherein the first transition length includes a length of a transitional edge between the top surface and the sidewall, wherein the second transition length includes a length of a transitional edge between the bottom surface and the sidewall;
 determining whether the first transition length or the second transition length is within the range of notch lengths; and
 determining that a respective corner in an image of the one or more images includes a notch when one of the first transition length or the second transition length is within the range of notch lengths.

10. The notch detection system of claim 9, wherein measuring a first transition length and a second transition length in each image of the one or more images comprises:
 generating a contour image from the image, wherein the contour image includes a contour of the portion of the sample in the image;
 rotating the contour image such that the sidewall is aligned to a horizontal direction;
 generating a derivative of the contour;
 determining the first transition length as a number of pixels of the derivative of the contour having positive values within a first selected range; and
 determining the second transition length as a number of pixels of the derivative of the contour having negative values within a second selected range.

11. The notch detection system of claim 9, wherein the one or more processors are further configured to execute program instructions causing the one or more processors to:

generate an error when both the first transition length and the second transition length are within the range of notch lengths.

12. The notch detection system of claim 9, wherein the one or more processors are further configured to execute program instructions causing the one or more processors to:
generate an error when the first transition length or the second transition length is outside of a range of allowable transition lengths.

13. The notch detection system of claim 1, wherein the known notch specifications include a range of notch slopes, wherein determining whether the respective corner in each image of the one or more images includes a notch comprises:
measuring a first notch slope and a second notch slope in each image of the one or more images, wherein the first notch slope includes a slope of a transitional edge between the top surface and the sidewall, wherein the second notch slope includes a slope of a transitional edge between the bottom surface and the sidewall;
determining whether the first notch slope or the second notch slope is within the range of notch slopes; and
determining that a respective corner in an image of the one or more images includes a notch when one of the first notch slope or the second notch slope is within the range of notch slopes.

14. The notch detection system of claim 13, wherein measuring a first notch slope and a second notch slope in each image of the one or more images comprises:
generating a contour image from the image, wherein the contour image includes a contour of the portion of the sample in the image;
rotating the contour image such that the sidewall is aligned to a horizontal direction;
generating a derivative of the contour;
determining the first notch slope as an average value of pixels of the derivative of the contour having positive values within a first selected range; and
determining the second transition length as an average value of pixels of the derivative of the contour having negative values within a second selected range.

15. The notch detection system of claim 13, wherein the one or more processors are further configured to execute program instructions causing the one or more processors to:
generate an error when both the first notch slope and the second notch slope are within the range of notch slopes.

16. The notch detection system of claim 13, wherein the one or more processors are further configured to execute program instructions causing the one or more processors to:
generate an error when the first notch slope or the second notch slope is outside of a range of allowable notch slopes.

17. The notch detection system of claim 1, wherein the notched surface includes one or more patterned features.

18. The notch detection system of claim 1, wherein a transition between the sidewall and at least one of the notched surface or the un-notched surface is chamfered.

19. The notch detection system of claim 1, wherein the one or more processors are further configured to execute program instructions causing the one or more processors to:
determine a thickness of the sample based on the image; and
generate an error when the thickness of the sample is outside of a selected range of allowable sample thicknesses.

20. The notch detection system of claim 19, wherein determining the thickness of the sample based on the image comprises:
generating a contour image from the image, wherein the contour image includes a contour of the portion of the sample in the image;
rotating the contour image such that the sidewall is aligned to a horizontal direction;
generating a derivative of the contour; and
determining the thickness of the sample as a number of pixels between a maximum value and a minimum value of the derivative of the contour.

21. A notch detection system, comprising:
an illuminator configured to provide diffuse illumination;
an imaging detector;
a stage configured to secure a sample, wherein the sample includes a notched surface and an un-notched surface parallel to the notched surface, wherein the notched surface and the un-notched surface are bounded by a sidewall, wherein the sample includes at least one notch providing a transitional surface between the notched surface and the sidewall having known notch specifications; and
a controller communicatively coupled to an imaging detector and the stage, the controller including one or more processors configured to execute program instructions causing the one or more processors to:
receive one or more images of a sample from the imaging detector, wherein each image of the one or more images includes a profile view of a respective corner of the sample, the profile view including at least a portion of the sidewall and top and bottom edges associated with the notched surface and the un-notched surface, wherein the stage positions the sample for each image of the one or more images such that illumination from an illuminator unobstructed by the sample is received by the detector, wherein the sample prevents illumination from the illuminator incident on the sidewall from reaching the detector;
determine whether the respective corner in each image of the one or more images includes a notch, wherein the notch is identifiable as a transitional edge between one of the top surface or the bottom surface and the sidewall having the known notch specifications;
identify the notched surface as one of the top surface or the bottom surface when a notch is detected; and
direct a sample positioner to position the sample with the notched surface in a selected direction when a notch is identified in at least one image of the one or more images.

22. The notch detection system of claim 21, wherein the sample includes a film deposited on the un-notched surface.

23. The notch detection system of claim 21, wherein the sample comprises:
a photomask.

24. The notch detection system of claim 21, wherein the one or more processors are further configured to execute program instructions causing the one or more processors to:
insert the sample in a fabrication tool with the notched surface in the selected direction when a notch is identified in at least one image of the one or more images.

25. The notch detection system of claim 24, wherein the fabrication tool comprises:
at least one of a metrology tool or a lithography tool.

26. The notch detection system of claim 21, wherein the one or more processors are further configured to execute program instructions causing the one or more processors to:

determine one or more characteristics of the sample based on at least one of a number or a distribution of notches identified on the sample in the one or more images.

27. The notch detection system of claim 26, wherein the one or more characteristics comprise:
a composition of a substrate of the sample.

28. The notch detection system of claim 26, wherein the one or more characteristics comprise:
a composition of a film on a surface of the sample.

29. The notch detection system of claim 21, wherein the known notch specifications include a range of notch lengths, wherein determine whether the respective corner in each image of the one or more images includes a notch comprises:
measuring a first transition length and a second transition length in each image of the one or more images, wherein the first transition length includes a length of a transitional edge between the top surface and the sidewall, wherein the second transition length includes a length of a transitional edge between the bottom surface and the sidewall;
determining whether the first transition length or the second transition length is within the range of notch lengths; and
determining that a respective corner in an image of the one or more images includes a notch when one of the first transition length or the second transition length is within the range of notch lengths.

30. The notch detection system of claim 29, wherein measuring a first transition length and a second transition length in each image of the one or more images comprises:
generating a contour image from the image, wherein the contour image includes a contour of the portion of the sample in the image;
rotating the contour image such that the sidewall is aligned to a horizontal direction;
generating a derivative of the contour;
determining the first transition length as a number of pixels of the derivative of the contour having positive values within a first selected range; and
determining the second transition length as a number of pixels of the derivative of the contour having negative values within a second selected range.

31. The notch detection system of claim 29, wherein the one or more processors are further configured to execute program instructions causing the one or more processors to:
generate an error when both the first transition length and the second transition length are within the range of notch lengths.

32. The notch detection system of claim 29, wherein the one or more processors are further configured to execute program instructions causing the one or more processors to:
generate an error when the first transition length or the second transition length is outside of a range of allowable transition lengths.

33. The notch detection system of claim 21, wherein the known notch specifications include a range of notch slopes, wherein determine whether the respective corner in each image of the one or more images includes a notch comprises:
measuring a first notch slope and a second notch slope in each image of the one or more images, wherein the first notch slope includes a slope of a transitional edge between the top surface and the sidewall, wherein the second notch slope includes a slope of a transitional edge between the bottom surface and the sidewall;
determining whether the first notch slope or the second notch slope is within the range of notch slopes; and
determining that a respective corner in an image of the one or more images includes a notch when one of the first notch slope or the second notch slope is within the range of notch slopes.

34. The notch detection system of claim 33, wherein measuring a first notch slope and a second notch slope in each image of the one or more images comprises:
generating a contour image from the image, wherein the contour image includes a contour of the portion of the sample in the image;
rotating the contour image such that the sidewall is aligned to a horizontal direction;
generating a derivative of the contour;
determining the first notch slope as an average value of pixels of the derivative of the contour having positive values within a first selected range; and
determining the second transition length as an average value of pixels of the derivative of the contour having negative values within a second selected range.

35. The notch detection system of claim 33, wherein the one or more processors are further configured to execute program instructions causing the one or more processors to:
generate an error when both the first notch slope and the second notch slope are within the range of notch slopes.

36. The notch detection system of claim 33, wherein the one or more processors are further configured to execute program instructions causing the one or more processors to:
generate an error when the first notch slope or the second notch slope is outside of a range of allowable notch slopes.

37. The notch detection system of claim 21, wherein the notched surface includes one or more patterned features.

38. The notch detection system of claim 21, wherein a transition between the sidewall and at least one of the notched surface or the un-notched surface is chamfered.

39. The notch detection system of claim 21, wherein the one or more processors are further configured to execute program instructions causing the one or more processors to:
determine a thickness of the sample based on the image; and
generate an error when the thickness of the sample is outside of a selected range of allowable sample thicknesses.

40. The notch detection system of claim 39, wherein determining the thickness of the sample based on the image comprises:
generating a contour image from the image, wherein the contour image includes a contour of the portion of the sample in the image;
rotating the contour image such that the sidewall is aligned to a horizontal direction;
generating a derivative of the contour; and
determining the thickness of the sample as a number of pixels between a maximum value and a minimum value of the derivative of the contour.

41. A system, comprising
a notch detection system, comprising:
an illuminator configured to provide diffuse illumination;
an imaging detector; and
a stage configured to secure a sample, wherein the sample includes a notched surface and an un-notched surface parallel to the notched surface, wherein the notched surface and the un-notched surface are bounded by a sidewall, wherein the sample includes at least one notch providing a transitional surface between the notched surface and the sidewall having known notch specifications; and a controller communicatively coupled to the imaging detector and the stage, the controller including one or more processors configured to execute program instructions causing the one or more processors to:

receive one or more images of a sample from the imaging detector, wherein each image of the one or more images includes a profile view of a respective corner of the sample, the profile view including at least a portion of the sidewall and top and bottom edges associated with the notched surface and the un-notched surface, wherein the stage positions the sample for each image of the one or more images such that illumination from an illuminator unobstructed by the sample is received by the detector, wherein the sample prevents illumination from the illuminator incident on the sidewall from reaching the detector;

determine whether the respective corner in each image of the one or more images includes a notch, wherein the notch is identifiable as a transitional edge between one of the top surface or the bottom surface and the sidewall having the known notch specifications; and identify the notched surface as one of the top surface or the bottom surface when a notch is detected; and a sample positioner configured to position the sample with the notched surface in a selected direction when a notch is identified in at least one image of the one or more images.

42. The notch detection system of claim 41, wherein the sample includes a film deposited on the un-notched surface.

43. The notch detection system of claim 41, wherein the sample comprises:

a photomask.

44. The system of claim 41, wherein the one or more processors are further configured to execute program instructions causing the one or more processors to:

insert the sample in a fabrication tool with the notched surface in the selected direction when a notch is identified in at least one image of the one or more images.

45. The system of claim 44, wherein the fabrication tool comprises:

at least one of a metrology tool or a lithography tool.

46. The notch detection system of claim 41, wherein the one or more processors are further configured to execute program instructions causing the one or more processors to:

determine one or more characteristics of the sample based on at least one of a number or a distribution of notches identified on the sample in the one or more images.

47. The notch detection system of claim 46, wherein the one or more characteristics comprise:

a composition of a substrate of the sample.

48. The notch detection system of claim 46, wherein the one or more characteristics comprise:

a composition of a film on a surface of the sample.

49. The system of claim 41, wherein the notched surface includes one or more patterned features.

50. The system of claim 41, wherein a transition between the sidewall and at least one of the notched surface or the un-notched surface is chamfered.

51. A method for notch detection, comprising:

receiving a sample including a notched surface and an un-notched surface parallel to the notched surface, wherein the notched surface and the un-notched surface are bounded by a sidewall, wherein the sample includes at least one notch providing a transitional surface between the notched surface and the sidewall having known notch specifications;

generating, with an imaging sub-system including an illuminator and a detector, one or more images of the sample, wherein each image of the one or more images includes a profile view of a respective corner of the sample, the profile view including at least a portion of the sidewall and top and bottom edges associated with the notched surface and the un-notched surface, wherein illumination from an illuminator unobstructed by the sample is received by the detector, wherein the sample prevents illumination from the illuminator incident on the sidewall from reaching the detector;

determining, with one or more processors, whether the respective corner in each image of the one or more images includes a notch, wherein the notch is identifiable as a transitional edge between one of the top surface or the bottom surface and the sidewall having the known notch specifications;

identifying the notched surface as one of the top surface or the bottom surface when a notch is detected; and positioning the sample with the notched surface in a selected direction when a notch is identified in at least one image of the one or more images.

52. The method for notch detection of claim 51, further comprising:

determining one or more characteristics of the sample based on at least one of a number or a distribution of notches identified on the sample in the one or more images.

* * * * *